(12) United States Patent
Steiner et al.

(10) Patent No.: US 8,700,970 B2
(45) Date of Patent: *Apr. 15, 2014

(54) SYSTEM AND METHOD FOR MULTI-DIMENSIONAL DECODING

(75) Inventors: Avi Steiner, Kiryat Motzkin (IL); Hanan Weingarten, Herzelia (IL)

(73) Assignee: Densbits Technologies Ltd., Haifa (IL)

( * ) Notice: Subject to any disclaimer, the term of this patent is extended or adjusted under 35 U.S.C. 154(b) by 347 days.

This patent is subject to a terminal disclaimer.

(21) Appl. No.: 13/036,796

(22) Filed: Feb. 28, 2011

(65) Prior Publication Data

US 2011/0214039 A1 Sep. 1, 2011

Related U.S. Application Data

(60) Provisional application No. 61/308,957, filed on Feb. 28, 2010.

(51) Int. Cl.
*H03M 13/00* (2006.01)

(52) U.S. Cl.
USPC ........... 714/755; 714/799; 714/786; 714/780; 714/797

(58) Field of Classification Search
USPC .......................... 714/755, 786, 799, 746, 797
See application file for complete search history.

(56) References Cited

U.S. PATENT DOCUMENTS

| | | | |
|---|---|---|---|
| 4,463,375 A | 7/1984 | Macovski | |
| 4,584,686 A | 4/1986 | Fritze | |
| 4,589,084 A | 5/1986 | Fling et al. | |
| 4,866,716 A | 9/1989 | Weng | |
| 5,077,737 A | 12/1991 | Leger et al. | |
| 5,297,153 A | 3/1994 | Baggen et al. | |
| 5,657,332 A | 8/1997 | Auclair et al. | |
| 5,729,490 A | 3/1998 | Calligaro et al. | |
| 5,793,774 A | 8/1998 | Usui et al. | |
| 5,920,578 A * | 7/1999 | Zook | 714/755 |
| 5,926,409 A | 7/1999 | Engh et al. | |
| 5,956,268 A | 9/1999 | Lee | |
| 5,982,659 A | 11/1999 | Irrinki et al. | |
| 6,038,634 A | 3/2000 | Ji et al. | |
| 6,094,465 A | 7/2000 | Stein et al. | |
| 6,119,245 A | 9/2000 | Hiratsuka | |
| 6,182,261 B1 | 1/2001 | Haller et al. | |
| 6,192,497 B1 | 2/2001 | Yang et al. | |
| 6,195,287 B1 | 2/2001 | Hirano | |

(Continued)

OTHER PUBLICATIONS

Search Report of PCT Patent Application WO 2009/118720 A3.

(Continued)

*Primary Examiner* — Guy Lamarre
(74) *Attorney, Agent, or Firm* — Dentons US LLP

(57) ABSTRACT

A system and method for decoding data. Multi-dimensional encoded data may be received that potentially has errors. The multi-dimensional encoded data may encode each input bit in a set of input bits multiple times in multiple different dimensions to generate encoded bits. The encoded bits may be decoded in at least one of the multiple dimensions. If one or more errors are detected in a plurality of encoded bits in the at least one of the multiple dimensions, an intersection sub-set of the encoded data may be decoded that includes data encoding the same input bits encoded by the plurality of encoded bits in at least a second dimension of the multiple dimensions. The values of the input bits by decoding the intersection sub-set may be changed.

24 Claims, 15 Drawing Sheets

(56) References Cited

U.S. PATENT DOCUMENTS

| | | |
|---|---|---|
| 6,199,188 B1 | 3/2001 | Shen et al. |
| 6,209,114 B1 | 3/2001 | Wolf et al. |
| 6,259,627 B1 | 7/2001 | Wong |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,290,203 B2 | 10/2007 | Emma et al. |
| 7,292,365 B2 | 11/2007 | Knox |
| 7,301,928 B2 | 11/2007 | Nakabayashi et al. |
| 7,441,067 B2 | 10/2008 | Gorobets et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,697,326 B2 | 4/2010 | Sommer et al. |
| 7,706,182 B2 | 4/2010 | Shalvi et al. |
| 7,804,718 B2 | 9/2010 | Kim |
| 7,805,663 B2 | 9/2010 | Brandman et al. |
| 7,805,664 B1 | 9/2010 | Yang et al. |
| 7,844,877 B2 | 11/2010 | Litsyn et al. |
| 7,961,797 B1 | 6/2011 | Yang et al. |
| 8,020,073 B2 | 9/2011 | Emma et al. |
| 8,122,328 B2 | 2/2012 | Liu et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2003/0065876 A1 | 4/2003 | Lasser |
| 2003/0101404 A1 | 5/2003 | Zhao et al. |
| 2003/0105620 A1 | 6/2003 | Bowen |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0153722 A1 | 8/2004 | Lee |
| 2004/0153817 A1 | 8/2004 | Norman et al. |
| 2004/0181735 A1 | 9/2004 | Xin |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1* | 12/2006 | Fagin et al. ............... 707/3 |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0103992 A1 | 5/2007 | Sakui et al. |
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0271494 A1 | 11/2007 | Gorobets |
| 2008/0010581 A1 | 1/2008 | Alrod et al. |
| 2008/0028014 A1 | 1/2008 | Hilt et al. |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0219050 A1 | 9/2008 | Shalvi et al. |
| 2008/0225599 A1 | 9/2008 | Chae |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0043951 A1 | 2/2009 | Shalvi et al. |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0144600 A1 | 6/2009 | Perlmutter et al. |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |

(56) References Cited

U.S. PATENT DOCUMENTS

| | | | |
|---|---|---|---|
| 2009/0213653 A1 | 8/2009 | Perlmutter et al. | |
| 2009/0213654 A1 | 8/2009 | Perlmutter et al. | |
| 2009/0228761 A1 | 9/2009 | Perlmutter et al. | |
| 2009/0240872 A1 | 9/2009 | Perlmutter et al. | |
| 2010/0005270 A1 | 1/2010 | Jiang | |
| 2010/0058146 A1 | 3/2010 | Weingarten et al. | |
| 2010/0064096 A1 | 3/2010 | Weingarten et al. | |
| 2010/0088557 A1 | 4/2010 | Weingarten et al. | |
| 2010/0091535 A1 | 4/2010 | Sommer et al. | |
| 2010/0095186 A1 | 4/2010 | Weingarten | |
| 2010/0110787 A1 | 5/2010 | Shalvi et al. | |
| 2010/0115376 A1 | 5/2010 | Shalvi et al. | |
| 2010/0122113 A1 | 5/2010 | Weingarten et al. | |
| 2010/0124088 A1 | 5/2010 | Shalvi et al. | |
| 2010/0131580 A1 | 5/2010 | Kanter et al. | |
| 2010/0131806 A1 | 5/2010 | Weingarten et al. | |
| 2010/0131809 A1 | 5/2010 | Katz | |
| 2010/0131826 A1 | 5/2010 | Shalvi et al. | |
| 2010/0131827 A1 | 5/2010 | Sokolov et al. | |
| 2010/0131831 A1 | 5/2010 | Weingarten et al. | |
| 2010/0146191 A1 | 6/2010 | Katz | |
| 2010/0146192 A1 | 6/2010 | Weingarten et al. | |
| 2010/0149881 A1 | 6/2010 | Lee et al. | |
| 2010/0180073 A1 | 7/2010 | Weingarten et al. | |
| 2010/0199149 A1 | 8/2010 | Weingarten et al. | |
| 2010/0211724 A1 | 8/2010 | Weingarten | |
| 2010/0211833 A1 | 8/2010 | Weingarten | |
| 2010/0211856 A1 | 8/2010 | Weingarten | |
| 2010/0251066 A1 | 9/2010 | Radke | |
| 2010/0253555 A1 | 10/2010 | Weingarten et al. | |
| 2010/0257309 A1 | 10/2010 | Barsky et al. | |
| 2010/0293321 A1 | 11/2010 | Weingarten | |
| 2011/0051521 A1 | 3/2011 | Levy et al. | |
| 2011/0055461 A1 | 3/2011 | Steiner et al. | |
| 2011/0096612 A1 | 4/2011 | Steiner et al. | |
| 2011/0119562 A1 | 5/2011 | Steiner et al. | |
| 2011/0153919 A1 | 6/2011 | Sabbag | |
| 2011/0161775 A1 | 6/2011 | Weingarten | |
| 2011/0214029 A1 | 9/2011 | Steiner et al. | |
| 2011/0214039 A1 | 9/2011 | Steiner et al. | |
| 2011/0246792 A1 | 10/2011 | Weingarten | |
| 2011/0246852 A1 | 10/2011 | Sabbag | |
| 2011/0252187 A1 | 10/2011 | Segal et al. | |
| 2011/0252188 A1 | 10/2011 | Weingarten | |
| 2011/0271043 A1 | 11/2011 | Segal et al. | |
| 2011/0302428 A1 | 12/2011 | Weingarten | |
| 2012/0001778 A1* | 1/2012 | Steiner et al. | 341/94 |
| 2012/0005554 A1 | 1/2012 | Steiner et al. | |
| 2012/0005558 A1 | 1/2012 | Steiner et al. | |
| 2012/0005560 A1 | 1/2012 | Steiner et al. | |
| 2012/0008401 A1 | 1/2012 | Katz et al. | |
| 2012/0008414 A1 | 1/2012 | Katz et al. | |
| 2012/0051144 A1 | 3/2012 | Weingarten et al. | |
| 2012/0063227 A1 | 3/2012 | Weingarten et al. | |
| 2012/0066441 A1 | 3/2012 | Weingarten | |
| 2012/0110250 A1 | 5/2012 | Sabbag et al. | |

OTHER PUBLICATIONS

Search Report of PCT Patent Application WO 2009/095902 A3.
Search Report of PCT Patent Application WO 2009/078006 A3.
Search Report of PCT Patent Application WO 2009/074979 A3.
Search Report of PCT Patent Application WO 2009/074978 A3.
Search Report of PCT Patent Application WO 2009/072105 A3.
Search Report of PCT Patent Application WO 2009/072104 A3.
Search Report of PCT Patent Application WO 2009/072103 A3.
Search Report of PCT Patent Application WO 2009/072102 A3.
Search Report of PCT Patent Application WO 2009/072101 A3.
Search Report of PCT Patent Application WO 2009/072100 A3.
Search Report of PCT Patent Application WO 2009/053963 A3.
Search Report of PCT Patent Application WO 2009/053962 A3.
Search Report of PCT Patent Application WO 2009/053961 A3.
Search Report of PCT Patent Application WO 2009/037697 A3.
Yani Chen, Keshab K. Parhi, "Small Area Parallel Chien Search Architectures for Long BCH Codes", Ieee Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-II-372 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com).
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", Ieee Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., " Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

US 8,700,970 B2

SYSTEM AND METHOD FOR MULTI-DIMENSIONAL DECODING

REFERENCE TO RELATED APPLICATION

This application claims the benefit of U.S. Provisional Patent Application No. 61/308,957, filed Feb. 28, 2010, which is incorporated herein by reference in its entirety.

FIELD OF THE INVENTION

Embodiments of the present invention relate to systems and methods that have encoding and/or decoding capabilities.

BACKGROUND OF THE INVENTION

The density of data stored in nonvolatile memory modules has dramatically increased during the last decade. This increase in density may cause a reduction in storage reliability and an increase in storage errors.

Furthermore, current system standards require significantly higher reliability in data retrieved from nonvolatile memory modules, such as flash memory, than from other data communication channels, such as telecommunication transmissions. In telecommunication networks, when an encoding error occurs in a signal, there are protocols to correct the error other than in-code error correction, such as, retransmission protocols that re-send signals. However, since original source data is generally inaccessible to a device accessing flash memory, retransmission may be impractical. Since the flash memory may rely solely on in-code error correction, system standards may allow a significantly smaller probability of error, e.g., on the order of $10^{-15}$, in flash memory output streams, than the allowable probability of error, e.g., on the order of $10^{-2}$ or $10^{-3}$, in communication transmissions.

There is a growing need in the art for efficient systems and methods for error correction codes that protect the information stored in nonvolatile memory modules from error.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
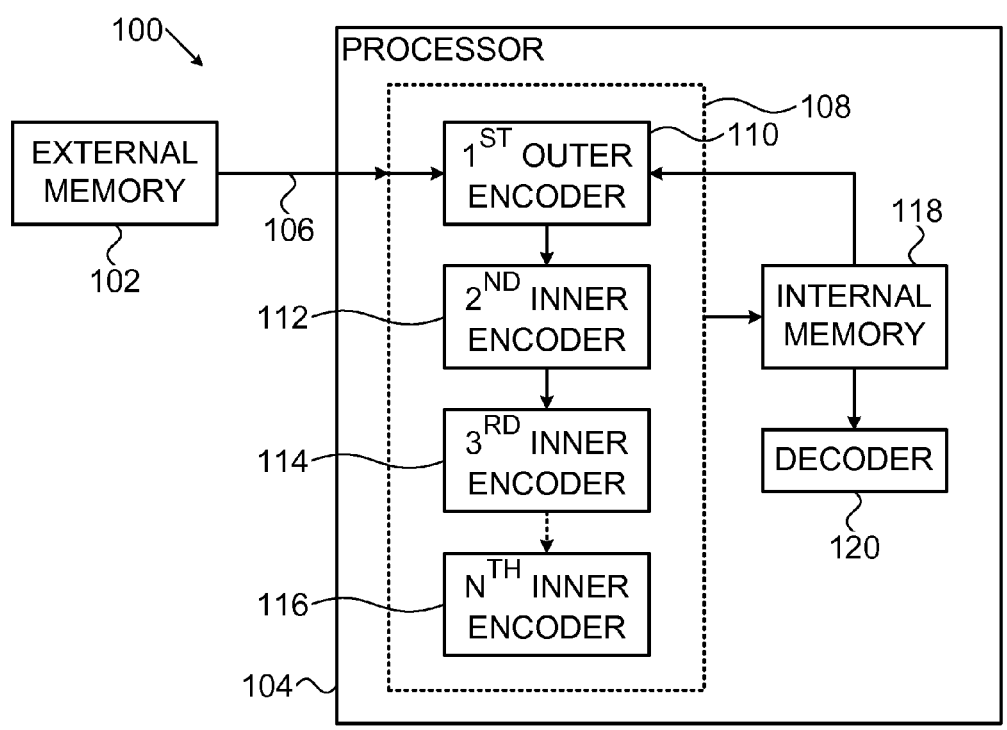
FIG. 1 schematically illustrates an encoding/decoding system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following description, various aspects of the present invention will be described. For purposes of explanation, specific configurations and details are set forth in order to provide a thorough understanding of the present invention. However, it will also be apparent to one skilled in the art that the present invention may be practiced without the specific details presented herein. Furthermore, well known features may be omitted or simplified in order not to obscure the present invention.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulates and/or transforms data represented as physical, such as electronic, quantities within the computing system's registers and/or memories into other data similarly represented as physical quantities within the computing system's memories, registers or other such information storage, transmission or display devices.

An encoder may encode input data. The input data may be arranged in a stream and grouped into segments or codewords. The input data may be retrieved from a multiple dimensional space, such as, a two-dimensional (2D) array or a three-dimensional (3D) cube of data in a source memory unit, such as, a flash memory. The space (e.g. the cube) may be an abstraction to allow easy consideration by human developers of the data arrangements, and the actual arrangement of data, physically, in the device, need not conform to the space.

An encoder may generate a first dimension of encoded data. The encoder may encode the input data stream in the order in which the data is listed in the stream, which in turn may be in the order of sequential rows in the multiple dimensional data array. Each row may have a different associated component code and accordingly, the encoder may encode each row separately by applying the respective component code thereto. In this way, the encoder may provide a first layer or dimension of encoding information.

An encoder may generate a second or greater dimension of encoded data by encoding a "folded" version of the input data. A "folded" version of a codeword may be an encoded representation of the codeword stored in a two or higher (multi)-dimensional space, for example, such as a two dimensional (2D) array or a three dimensional (3D) cube of data. The dimensions may be ordered. Each dimension may be encoded by multiple component encoders. The folded version of the component codewords (e.g., the folded input data encoded by a component encoder) may represent the codeword in more than a single row and more than a single column of the storage space. This set of folded input data may include the same or overlapping data input into the first dimensional encoding, but which is re-arranged and encoded with different component codes. Therefore, the extra dimensional encoded data may provide an extra layer of information encoding the same or overlapping input data for more accurate and precise encoding.

In some embodiments, a first encoding process may generate a one dimensional (1D) set of codewords or "outer" codewords, for example, by encoding the original set of non-encoded input data. Further encoding processes may generate each additional, second or higher dimensional set of codewords or "inner" codewords, for example, by encoding a folded version of a set of codewords obtained by applying a previous encoding process. Accordingly, multi-dimensional encoders may encode each input bit by multiple codes, for example, in a different set of encoded data for each dimension. The (1D) set of outer codewords and the (p) dimensional set of inner codewords may be combined to form a multi-dimensional set of encoded data with (p+1) dimensions, where p is a positive integer. Together, the multiple different encoders may encode the same set of input data multiple times in multiple (p+1) different dimensions.

Once the input data is encoded, the encoded data may be stored, for example, in a flash memory, read from storage, and decoded.

Some embodiments of the invention use a "hard" decoder, while other embodiments use a "soft" decoder. A hard decoder may receive a stream of bits from a threshold detector that defines each bit to have an exact and definite value, for example, either a one or a zero. For example, if a voltage of a bit is greater than a threshold, the bit may be considered to be definitely a one (1) regardless of how close the voltage is to the threshold. If the voltage is less, the bit may be considered to be definitely zero (0). In contrast, a soft decoder inputs a stream of "soft bits," which include not only a 1 or 0 (hard bit information) but also a measure of the certainty or probability that the bit value is valid or correct, for example, a measure of how close the voltage is to the decision threshold (soft bit information). In some example, each data element may have multiple (e.g., 8 or 16) bits.

In hard decoding systems, a hard decoder may decode an entire data stream or stream segment in each decoding iteration. However, in some cases, errors are not uniformly distributed throughout data streams and after one or more iteration of decoding, some stream segments may be completely corrected, while other stream segments may still have errors. Since later decoding iterations typically only have isolated errors in specific sub-segments, continuing to decode the entire stream may waste decoder resources.

To increase decoder efficiency, after one or more iterations of decoding an entire data stream in one dimension (e.g., the $1^{st}$ or outer dimension), if errors are still detected, instead of continuing to decode the entire data stream, a decoder may isolate the errors and decode only the erroneous stream segments in different dimensions (e.g., the $2^{nd}$ or greater or inner dimensions). The decoder may decode "intersection" sub-sets or sub-segments of the encoded data streams in one or more additional dimension(s) that intersect the erroneous data stream in the initially decoded dimension. The intersection sub-sets of the encoded data may include encoded data in the additional dimension(s) that encode the same input bits (or encoded versions thereof) for which errors are detected in the initial decoding dimension. In one example, an intersection may include the largest set of bits which were originally encoded by two (or more) components of different dimensions.

Some embodiments of the invention may decode the entire data stream for only the single outer data stream encoding data in only the first dimension (1D) and may decode the intersection sub-set of the other inner data stream(s) encoding data in each of the other second or higher (p+1) dimensions.

The decoder may change or correct the values of the erroneous intersection input bits in the intersection sub-sets. Accordingly, when the entire stream decoding is insufficient or does not progress, for example when the initial (e.g., outer) decoder continually outputs the same errors after a predetermined number of one or more decoding iterations, one or more additional (e.g., inner) decoders may decode the sub-sets of the data streams of the additional dimensional encoded data at the intersections of those data streams. By decoding only the sub-sets of data streams at these erroneous intersections instead of the entire data streams, fewer resources may be used to correct errors, thereby providing a more efficient decoder.

In soft decoding systems, a higher error rate may be expected than in the hard decoding systems, and therefore every bit value may be associated with a probability instead of a certain hard decision of that bit value. The bit values may be defined by soft bit information, such as, a probability that each bit value is correct or valid. For a codeword of k information bits, the number of different possible bit values (for binary (0) or (1) bits) is $2^k$. Each of the ($2^k$) combinations of different bit values may be a hypothesis or potential "candidate" error correction for the codeword. Each different candidate error correction may define a different suggestion for changing one or more bit values in the codeword (hard bit values) and an associated reliability or probability that the codeword is valid when the suggested changes of the candidate are applied (soft bit values). Since different candidates have different probabilities that the change they suggest is a valid codeword correction, it may be more efficient to decode or analyze a sub-set of the highest probability candidates, for example, in the order of their probabilities, instead of decoding all candidates including the lower probability candidates. However, ordering or enumerate the candidates according to their associated soft bit probabilities of being valid corrections may be a prohibitively complex operation, for example, having a complexity that grows exponentially with the number of information bits per codeword.

According to some embodiments of the invention, a soft decoder may map the soft bit values associated with each of the plurality of candidate error corrections, for example, indicating the probability that a candidate is valid, to a uniform, linear, integer or otherwise equally spaced scale or grid. Once the different candidate soft bit values are mapped to the finite uniform scale, candidates may be ordered so that their combined associated mapped soft bit values are monotonically ordered (e.g., monotonically non-decreasing when soft bit values are sum-LLR values or, conversely, monotonically non-increasing when soft bit values are probabilities of validity). Ordering of candidates may be simplified in such embodiments to sorting bounded uniform (e.g., integer) candidate values in a non-decreasing partial sum ordering, which has, for example, a linear time complexity (e.g., significantly less complex than the unbounded partial sum ordering of the un-mapped non-uniform initial soft bit values).

Once a list or group of candidate error corrections is ordered, each candidate may be soft decoded and analyzed for accuracy. Candidates that meet predetermined criteria, for example, having a highest, above threshold, and/or converging probabilities of validity, may be selected from among the candidates and used to correct the codewords.

According to some embodiments of the invention, a soft decoder may decode multi-dimensional encoded data including multiple versions of the same data bits encoded multiple times by different component codes in different dimensions. The multi-dimensional soft decoder may soft decode the multiple versions of the data in each dimension iteratively to further refine and correct the data in each extra dimension.

In one embodiment, in a first of the multiple dimensions, the soft decoder may soft decode a component code (including hard bit values and soft bit values) to generate a plurality of candidate error corrections. Each candidate may define a different suggested change to the hard bit values and may be associated with soft bit values (e.g., probabilities of validity) for the component code. The plurality of candidates may be a sub-set of the highest probability corrections of all potential error corrections for the component code. The soft decoder may select one of the plurality of candidate error corrections according to the associated soft bit values. In some embodiments, the soft decoder may select the candidate associated with the highest, within a threshold range, a predetermined value or range, and/or having converging differences or ratios of probabilities of validity.

Once the one or more candidates are selected in the first dimensions, the soft decoder may update the component code in the first dimension of data by applying the suggested changes of the selected candidate. The updated component code may have modified hard bit values (and associated modified soft bit values). The updated component code (partially or completely corrected by decoding in the first dimension) may be input into a soft decoder in one or more additional dimension (for further correction by decoding in the additional dimension(s)).

The soft decoder may iteratively repeat, for each component code in the one or more additional dimensions of multi-dimensional encoded data, the steps of soft decoding to generate a candidate list, selecting a preferred candidate and updating the component code with the selected candidate. Each subsequent dimension may input the updated component code generated in a dimension of a previous iteration. In this way, the component code data may be iteratively refined, for example, until a predetermined confidence criterion is satisfied, such as, the data having less than a predetermined number of errors (e.g., zero) or less than a predetermined probability of error (e.g., $10^{-15}$) is detected.

In some embodiments, to refine and select the plurality of candidates, the soft decoder may cross-reference candidates from multiple dimensions suggesting contradictory corrections for the same data bits in different dimensions. The soft decoder may eliminate candidates or decrement their associated reliability metric (e.g., defined in the candidate's associated soft bit values or a reliability score) in one dimension if there are contradictory candidates in another dimension. A candidate error correction generated for one component code in one dimension that suggests inverting one or more component bits may contradict another candidate generated for the updated or a different component code in another dimension that suggests re-inverting one or more of the same of overlapping bits. Candidates that suggest corrections to re-invert already inverted bits are less likely to be valid. Accordingly, eliminating or decreasing such contradictory candidates' associated probability of validity may reduce unlikely candidates.

In some embodiments, when the reliability (soft bit value probability of validity) of a component codeword corrected in one dimensions is substantially high, re-analyzing the corrected codeword in another dimension is a waste of computational resources and may generate false errors by re-inverting already correctly inverted bits. Accordingly, embodiment of the invention may bypass or override soft decoding in subsequent dimensions by "boosting" the reliability metric (soft bit values) of reliable component codes corrected in the one dimension to force the codeword through other dimensions without further corrections. For example, if the soft bit values of a component code updated by a candidate correction indicate an above threshold reliability or probability for the updated component code (e.g., above threshold log-likelihood ratio (LLR) values), the soft decoder may "boost" or further increase the reliability of the soft bit values for the updated component code, for example, to a maximum reliability (e.g., maximum LLR values). The soft decoder may modify soft bit values by re-setting, scaling, shifting or mapping the soft bit values to the new updated maximum reliability values to shift probabilities of codeword validity to extremely high or maximum values (e.g., one). Updated component codewords with maximal reliability soft bit values input into subsequent dimensional encoders may be marked correct and bypass additional (unnecessary) encoding.

However, in some cases, a false correction may be erroneously marked as a valid correction and forced through additional dimension decoding to bypass necessary correction. In such cases, the original overridden probabilities (e.g., original soft bit values) may be used to identify and reverse the false correction. Such cases of false corrections may be identified, for example, if no new errors are determined to be corrected after a predetermined number of one or more consecutive soft decoding iterations. When false corrections are identified, the modified probabilities of candidate error corrections may be returned to their original probabilities. In some embodiments, the absolute values of the original probabilities (e.g., indicating the extent of uncertainty of the validity of the bits) may be returned, but not necessarily the signs of the original probabilities (e.g., indicating the suggested bit values).

Reference is made to FIG. 1, which schematically illustrates an encoding/decoding system 100 including an encoder 108 and a decoder 120 according to an embodiment of the invention.

System 100 may include a computer device capable of executing a series of instructions to store, save, process, encode, decode, compute, edit, receive, transfer, display, or otherwise use or manipulate data. System 100 may include one or more computers, workstations, cellular device, tablet devices, personal digital assistants (PDA), video game consoles, etc. In one embodiment, system 100 may be a computer with a flash memory or disk drive.

System 100 may include an external memory 102 and an internal memory 118. External memory 102 may include, for example, a non-volatile memory, a flash memory, one or more external drives, such as, a disk or tape drive, a graphics card, an input/output device port, a network card or an external memory in an internal or external device. Internal memory 118 may include, for example, volatile memory, random access memory (RAM), dynamic RAM (DRAM), cache memory, buffer memory, scratchpad memory, or other suitable memory units or storage units for direct use by a processor 104. Internal memory 118 may be a short-term memory unit, while external memory unit 102 may be a long-term memory unit; however, either of these memories may be long-term or short-term memory units.

A processor 104 may retrieve read, write, and/or transfer data to and from memory unit 102. Processor 104 may retrieve an input stream 106 of data from memory unit 102. Processor 104 may provide encoder 108 with input stream 106. Encoder 108 may include an outer encoder 110 and one or more inner encoder 112,114, . . . , 116 to encode input stream 106. Each encoder 110-116 may encode the same or overlapping data to provide multiple different versions of the same encoded data. Encoder 108 may be a dedicated hardware unit, or processor 104 executing software.

Outer encoder 110 may encode the original input stream 106, for example, comprising the original data retrieved from external memory 102, and may output a sequence of encoded outer codewords. The output of outer encoder 110 may be stored in internal memory 118 as a linear (1D) sequence of encoded bits.

Inner encoder(s) 112-116 may encode original input stream 106 or a folded versions thereof, for example, output from a previous encoder. In some embodiments, inner encoder(s) 112-116 may encode the same input stream 106, for example, in parallel, for some or all code dimensions. The encoded data output from each of inner encoder(s) 112-116 may be stored in internal memory 118 as a second or greater dimension of encoded data.

In one embodiment, a second ($2^{nd}$) inner encoder 112 may encode a folded version of the output stream of first encoder 110, a third ($3^{rd}$) inner encoder 114 may encode a folded version of the output stream of second inner encoder 112, fourth ($4^{th}$) inner encoder may encode a folded version of third inner encoder 114, and so on until an ultimate ($N^{th}$) inner encoder 116 may encode a folded version of the penultimate (($N-1)^{th}$) inner encoder. (A number of encoders other than four may be used.) The encoders are thus ordered.

Each inner encoder (e.g., second or greater encoder 112-116) may input a folded (2D) version of the output data in a dimension of the previous encoder. Accordingly, each new inner encoder 112-116 adds an extra (1) dimension of information to the output encoded data for each original bit. For example, the ($N^{th}$) inner encoder 116 may output (N)-dimensional data.

Encoding may be executed by encoders 110-116 using a linear feedback shift register through which the data (e.g., systematic data) is passed. Systematic data may pass through each encoder 110-116 without being modified while the linear feedback shift-register of the encoder 110-116 advances. The output of the linear feedback shift register may be redundancy bits of the passing code and may be appended to the output data stream. In other embodiments, the bits of input stream 106 may be changed to encoded versions thereof by 110-116. In some embodiments, a bit may refer to the smallest data unit that may be individually processed, which may be a single bit or a plurality of (V)-bits (e.g., 8 or 16 bits) that encoders 110-116 may encode at a time.

In some embodiments, encoder 108 need not include multiple separate outer and inner encoders 110-116. For example, outer and inner encoders 110-116, or inner encoders 112-116 alone, may be integral or only one encoder may be used. In other embodiments, both inner and outer encoding processes may be executed by the same encoder unit in different computational cycles. When processor 104 includes multiple processors or multiple processing cores, each available processor or core may execute a separate encoder 110-116, for example, in parallel.

The output of each encoder 110-116 may be an output stream, which is essentially a shifted version of the input stream with redundancy information. Encoders 110-116 may encode data streams "on the fly" such that, for example, an N+1-dimensional encoder may encode the streaming output of the N-dimensional encoder as it passes onto the N+1 encoder. Therefore, encoding in all dimensions may have minimal latencies.

The cumulative output of the multiple encoders of encoder 108 may be multi (N)-dimensional encoded data. The multi-dimensional encoded data may include one or more data streams encoding each of a plurality of input bits multiple times in multiple different dimensions (e.g., of a multi-dimensional data structure in external memory 102).

The encoded data may be encoded with a plurality of different component codes in each dimension. Different component codes may be used to achieve a high coding diversity over each dimension of the multi-dimensional code. In one example, irregular component codes may be used. In an example of simple irregular multi-dimensional encoding of folded component codes, every component code may have the same length (e.g., determined by number of planes per component code) and may encode with variable redundancy size. Thus, some components may have higher error correction capabilities than other components in the same dimension.

In one embodiment, the first outer encoder 110 may encode sequential rows and each inner encoder 112-116 may encode multiple rows and multiple columns of a source data array or cube linked together to form a linear data stream using different component codes to encode each respective associated row or column vector. The output data streams may periodically change or interleave component codes, for example, as input row and/or column vectors change. Together, encoder 112-116 may generate multiple encoded versions or dimensions of the same or overlapping data, for example, to generate multi-dimensional encoded data.

Once the multi (N)-dimensional encoded data is generated, the data may be stored in internal memory 118, such as, a flash memory. A processor (e.g., processor 104) may receive a program or instruction requesting data from external memory 102. The processor or a memory controller may transfer the corresponding multi-dimensional encoded data from the corresponding location in internal memory 118, for example, where the data is readily accessible to the processor. Decoder 120 may decode the multi-dimensional encoded data by soft or hard decoding. Decoder 120 may be a dedicated hardware unit, or processor 104 executing software.

When hard decoding, decoder 120 may decode the entire outer output stream of the first outer encoder 110, for example, correcting errors during decoding. If errors persist for a set of input bits in the output stream of outer encoder 110, instead of decoding the entire inner output streams of inner encoders 112-116, decoder 120 may decode corresponding intersection segments of the inner and outer streams, for example, decoding the corresponding bits in other dimensions. Intersection stream segments may include input bits that may each be encoded by different component codes from different dimensions. Accordingly, if one stream segment includes erroneous bits, the intersecting stream segments of other dimensions are therefore also likely to include erroneous bits.

When soft decoding, decoder 120 may generate a plurality of candidate error corrections for each component code. Decoder 120 may map the soft bit values for the plurality of candidate error corrections to a uniform scale, for example, to simplify ordering the plurality of candidate error corrections according to their associated soft bit values. Decoder 120 may order the candidate error corrections to have associated combined mapped values in a monotonically non-decreasing order. Decoder 120 may decode the candidate error corrections in their combined mapped value order, but using the associated original (e.g., non-mapped) soft bit values.

When soft decoding multi-dimensional data, decoder 120 may soft decode multiple different versions of the same data in the multiple different dimensions to iteratively refine the data in each successive dimension. Decoder 120 may generate a plurality of candidate error corrections for each component code in a first dimension. Decoder 120 may use the soft bit values of the candidate error correction reliability to narrow the list and select a single candidate. The selected candidate may be applied to update the component code to generate a reduced error input for the next sequential dimensional decoding. Decoder 120 may repeat the soft decoding process for each subsequent dimension (and/or may repeatedly cycle through previous dimension) with updated/reduced error data, for example, until the data has none or a below threshold probability of error in the associated soft bit values. In one embodiment, decoder 120 may eliminate candidates or decrease the reliability metric of candidates in one dimension that suggest data bit changes that are contradicted by another candidate encoding the same data in a different dimension. In some embodiments, if the reliability of a component codeword corrected in a first dimension is sufficiently high, decoder 120 may lock or set the correction, for example, by assigning the codeword maximum reliability soft bit values, to force the codeword through subsequent dimensions without additional decoding.

Figure 2:
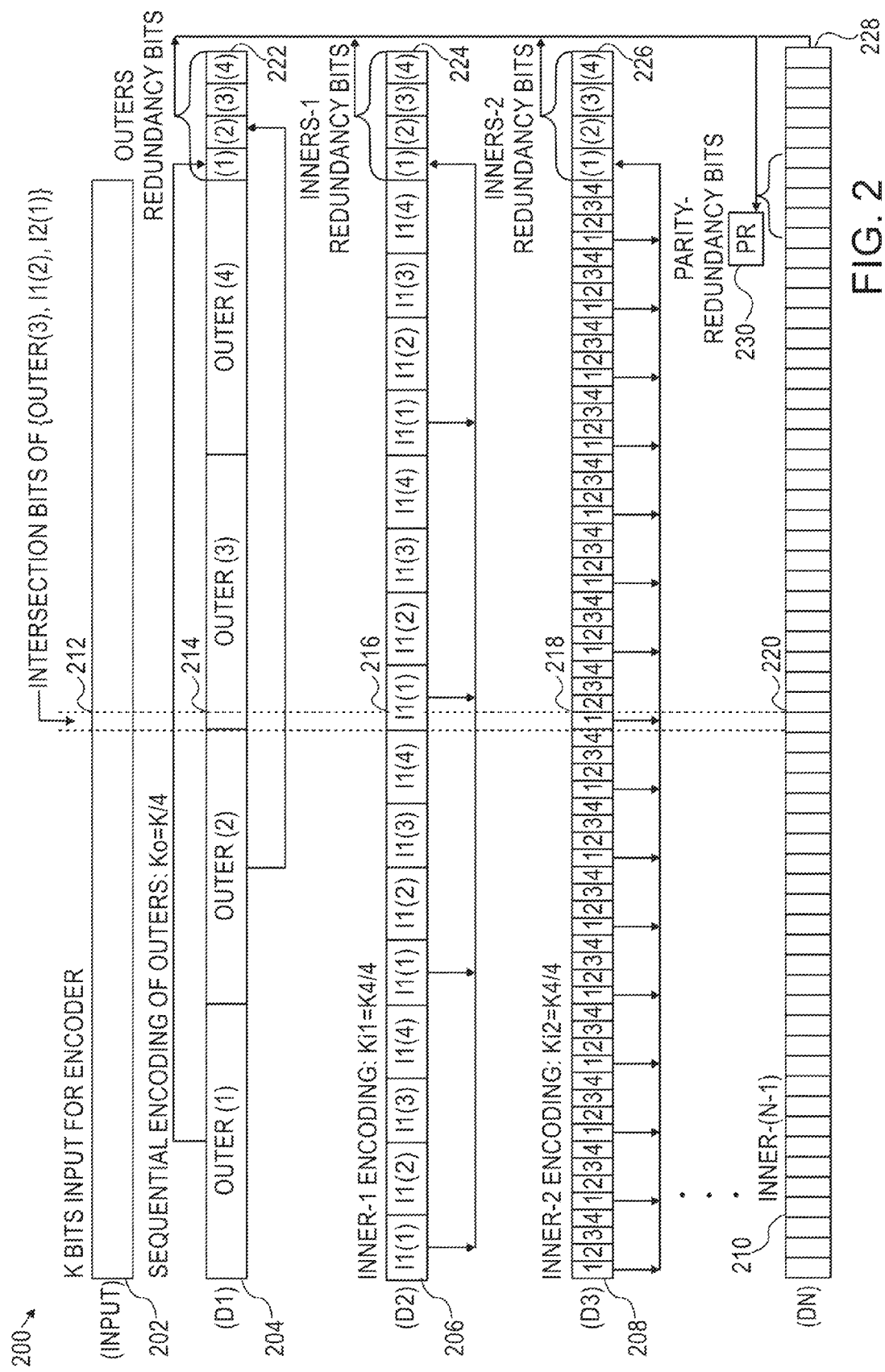
FIG. 2 schematically illustrates data structures for storing multi-dimensional code encoded and decoded by the system of FIG. 1 according to an embodiment of the invention.

System 100 may provide high performance decoding of multi-dimensional codes (e.g., N-dimensional codes shown in FIG. 2). Component codes may be decoded together or separately in each of the multiple dimensions.

Encoder 108 and decoder 120 may be software-implemented using dedicated instruction(s) (e.g., stored in a memory 102,118 of FIG. 1) or, alternatively, hardware-implemented using designated circuitry such as a proprietary digital logic array, which may be produced on a semiconductor chip, for example, including multiple-input/multiple-output logic circuits, linear feedback shift-registers, threshold detectors, and/or other encoder or decoder components. A hardware-implemented encoder/decoder may be produced on a dedicated chip to obtain relatively low latency, while a software implementation may be used in presence of relaxed delay constraints.

Reference is made to FIG. 2, which schematically illustrates data structures for storing multi-dimensional code 200 encoded and decoded by the system 100 of FIG. 1 according to an embodiment of the invention.

An encoder (e.g., encoder 108 of FIG. 1) may receive an input stream 202 (e.g., input stream 106 of FIG. 1) of, for example, k bits. The encoder may include an outer encoder (e.g., outer encoder 110 of FIG. 1) and one or more inner encoder(s) (e.g., inner encoders 112-116 of FIG. 1).

The outer encoder may generate a single "outer" or first dimensional (D1) encoded data stream 204. Outer encoded data stream 204 may include data representing different segments of (e.g., $$\frac{k}{q}$$

bits of) input stream 202 encoded by (e.g., q) different component codes (e.g., component codes Outer(1)-Outer(4) for q=4). For systematic data, the data stream 204 may include input stream 202 itself and encoded data, for example, a first set of parity bits (P1) 222 (e.g., redundancy bits). In the example in FIG. 2, component code, "Outer (i)," may encode the single $i^{th}$ set of $$\frac{k}{4}$$

input bits of input stream 202 to generate outer parity bits 222, (i), for i=1, 2, 3, 4.

A first inner encoder (e.g., inner encoder 112 of FIG. 1) may generate a first "inner" or second dimensional (D2) encoded data stream 206, for example, by cycling component codes to encode folded outer encoded data stream 204. Inner encoded data stream 206 may include data representing folded segments of (e.g., $$\frac{k}{q^2}$$

bits of) outer encoded data stream 204 encoded by (e.g., q) different component codes (e.g., component codes I1(1)-I1(4) for q=4). Each component code may be interleaved through inner encoded data stream 206 to periodically encode folded segments of encoded data stream 204, repeating, iterating or cycling every $$\frac{k}{q}$$

bits for a segments length of $$\frac{k}{q^2}$$

bits. In the example in FIG. 2, component code "Inner-1(i)" may encode the four i+n $$\frac{k}{16}^{th}$$

sets of input bits to generate inner-1 parity bit (i), for i=1, 2, 3, 4, for a second set of parity bits (P2) 224. For systematic encoding, the data stream 206 may include folded segments of input stream 204 itself and second set of parity bits (P2) 224.

A second inner encoder (e.g., inner encoder 114 of FIG. 1) may generate a second inner or third dimensional (D3) encoded data stream 208, for example, by cycling component codes to encode folded inner encoded data stream 206. Inner encoded data stream 208 may include data representing folded segments of (e.g., bits of) inner encoded data stream 206 encoded by (e.g., q) different component codes (e.g., component codes I2(1)-I2 (4) for q=4). Each component code may be interleaved through inner encoded data stream 208 to periodically encode folded segments of encoded data stream 206, repeating or cycling every $$\frac{k}{q^2}$$

bits for a segment length of $$\frac{k}{q^3}$$

bits. In the example in FIG. 2, component code "Inner-2($i$)" may encode the sixteen i+n $$\frac{k}{64}^{th}$$

sets of input bits to generate inner-2 redundancy bit (i), for i=1, 2, 3, 4, for a third set of parity bits (P2) 226.

Additional inner encoders up to (N−1) inner encoders may generate up to (N−1) inner or (N) multiple dimensional (DN) encoded data stream 210, where N is a positive integer greater than 2. To generate inner encoded data stream (N−1) 210, the encoder may cycle component codes to encode folded inner encoded data stream (N−2). Inner encoded data stream 210 may include data representing folded segments of (e.g., $$\frac{k}{q^N}$$

bits of) inner encoded data stream 206 encoded by (e.g., q) different component codes (e.g., component codes I(N−1) (1)-I(N−1)(4) for q=4). Component codes may be interleaved through inner encoded data stream (N−2) and may generate an ($N^{th}$) set of parity bits (PN) 228.

Each component code may be applied to single planes (for outer encoded codes) or multiple (folded) planes (for inner encoded codes) of a source memory data structure to generate parity (redundancy) bits 222-228. Code 200 may be an N-dimensional data structure that includes a first set of parity bits (P1) 222 generated by applying a first encoding process, a second set of parity bits (P2) 224 generated by applying a second encoding process and a third set of parity bits (P3) 226 generated by applying a third encoding process. The second encoding process may be applied to a folded version of first codewords (generated by the first encoding process). The third encoding process may be applied to a folded version of second codewords (generated by the second encoding process). The iterative encoding process may repeat or iterate up to the Nth encoding process applied to a folded version of (N−1) codewords (generated by the (N−1) encoding process). In some embodiments, an additional encoding process may be applied only to the parity bits (P1, P2, P3) 222-228 themselves (and not to the input streams they encode) to generate an additional set of parity bits 230.

Multiple encoders (e.g., encoders 110-116 of FIG. 1) may be used to encode data in each dimension. Each sub-set of code from input stream 202 may be input into a component encoder in each dimension. In total, the multiple encoders may generate (N)-dimensional code 200 and/or their associated parity bits 230.

The multiple (N) dimensions of code 200 may represent multiple dimensions of the source of the encoded information bits in multiple-dimensions of a non-volatile memory space (e.g., external memory 102 of FIG. 1, such as, flash memory). In one embodiment, each (e.g., one) additional dimension of code 200 may represent data encoded over an increasing number of dimensions of the source memory data structure (e.g., incremented by 1). In another embodiment, there may be a one-to-one correspondence of dimensions of code and dimensions of the source memory data structure, where each additional dimension of code 200 may represent data encoded in a single dimension (e.g., a single plane). In yet another embodiment, each different dimension may apply a different set of component codes to the same or overlapping data (e.g., rearranged, folded, previously encoded, or not) to generate a different encoded version thereof. Other relationships may exist between the dimensions of code 200 and the dimensions of the source memory data structure encoded thereby. Code 200 may be stored, for example, in volatile memory (e.g., internal memory 118 of FIG. 1) for decoding.

A hard decoder (e.g., decoder 120 of FIG. 1) may receive multi-dimensional code 200, for example, from a memory unit (e.g., internal memory 118). The decoder may first analyze the first dimensional outer encoded data stream 204. If the decoder detects errors in encoded bits 214 in the data stream 204, the decoder may deduce that there may be one or more error(s) in the associated input sub-stream or bits 212 that erroneous bits 214 encode. The decoder may execute a targeted search of specific corresponding intersection bits 216, 218, 220 in higher dimensional (inner) encoded data streams 206-210 that encode the same (or overlapping) erroneous input bits 212 of input stream 202. Intersection bits 216, 218, 220 may be generated by encoding folded versions of the same or overlapping input bits 212 with multiple different component codes (e.g., Inner-1, Inner-2, Inner-(N−1)) in each dimension to generate a different encoded version of the same data in each of the multiple different dimensions. Accordingly, multiple sets of intersection bits 216, 218, 220 in (N) different dimensions may provide (N) different encodings of a plurality of common data bits, thereby providing extra information for correcting an error therein.

The decoder (e.g., decoder 120 of FIG. 1) may decode all corresponding intersection bits, for example, one dimension at a time, or multiple dimensions together, in parallel, or may decode a sub-set of the intersection bits from a sub-set of the multiple dimensions, for example, until one or more errors are found. If errors are found in intersection bits 216, 218, 220, the decoder may correct the errors by changing the values of the corresponding input bits 212 and may save the correction to internal memory.

Each set of intersection bits 216-220 may be encoded by a single component code for uniformity. Accordingly, the more component codes interleaved in each dimension, the fewer the number of bits in each intersection bit-set 216-220. For irregular folded component codes, the length of intersection bits 216-220 may change, for example, as the length of the component codes themselves change in the same dimension.

Figure 3:
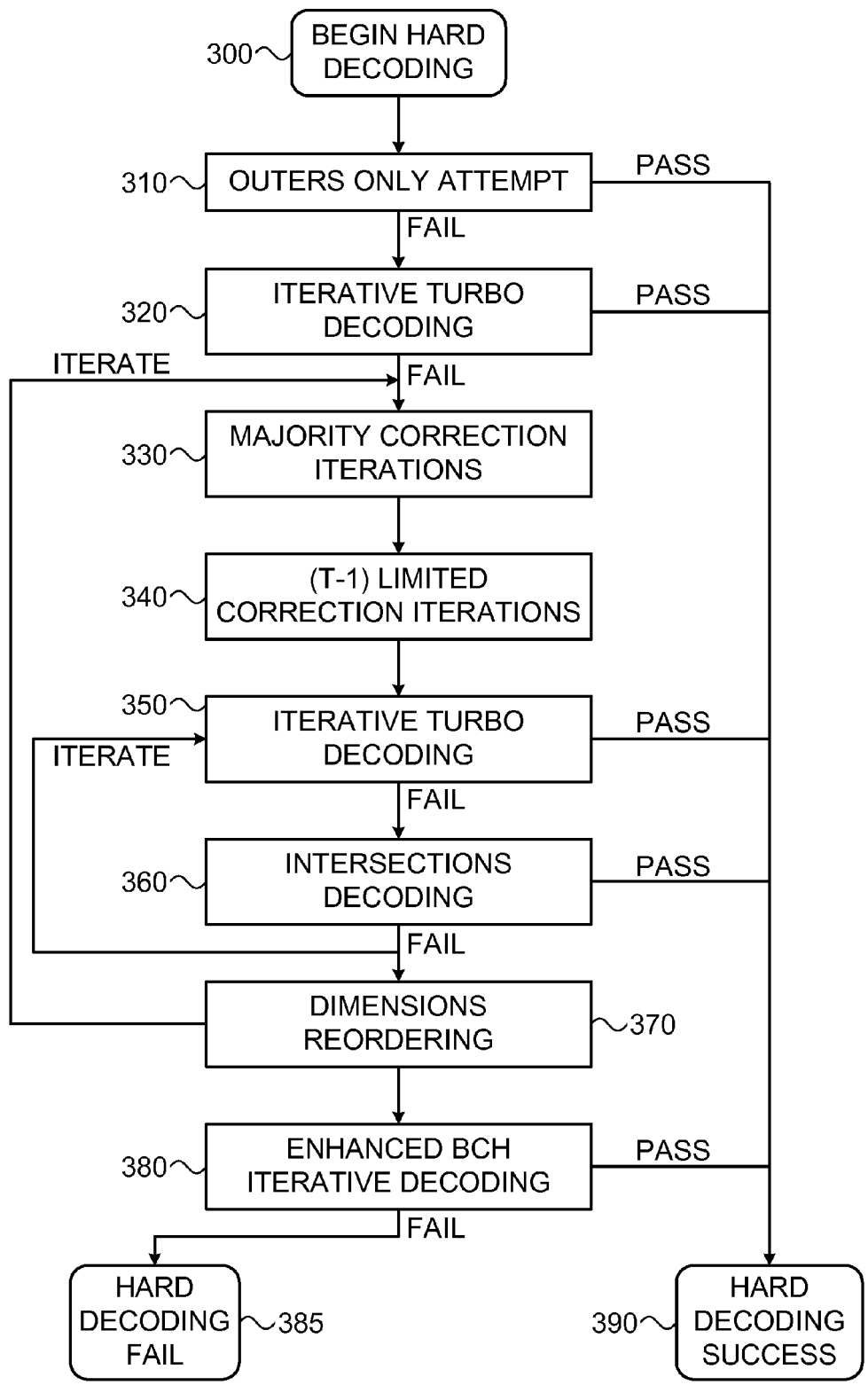
FIG. 3 is a flowchart of a method for iterative hard decoding of multi-dimensional encoded data according to an embodiment of the invention.
Figure 4:
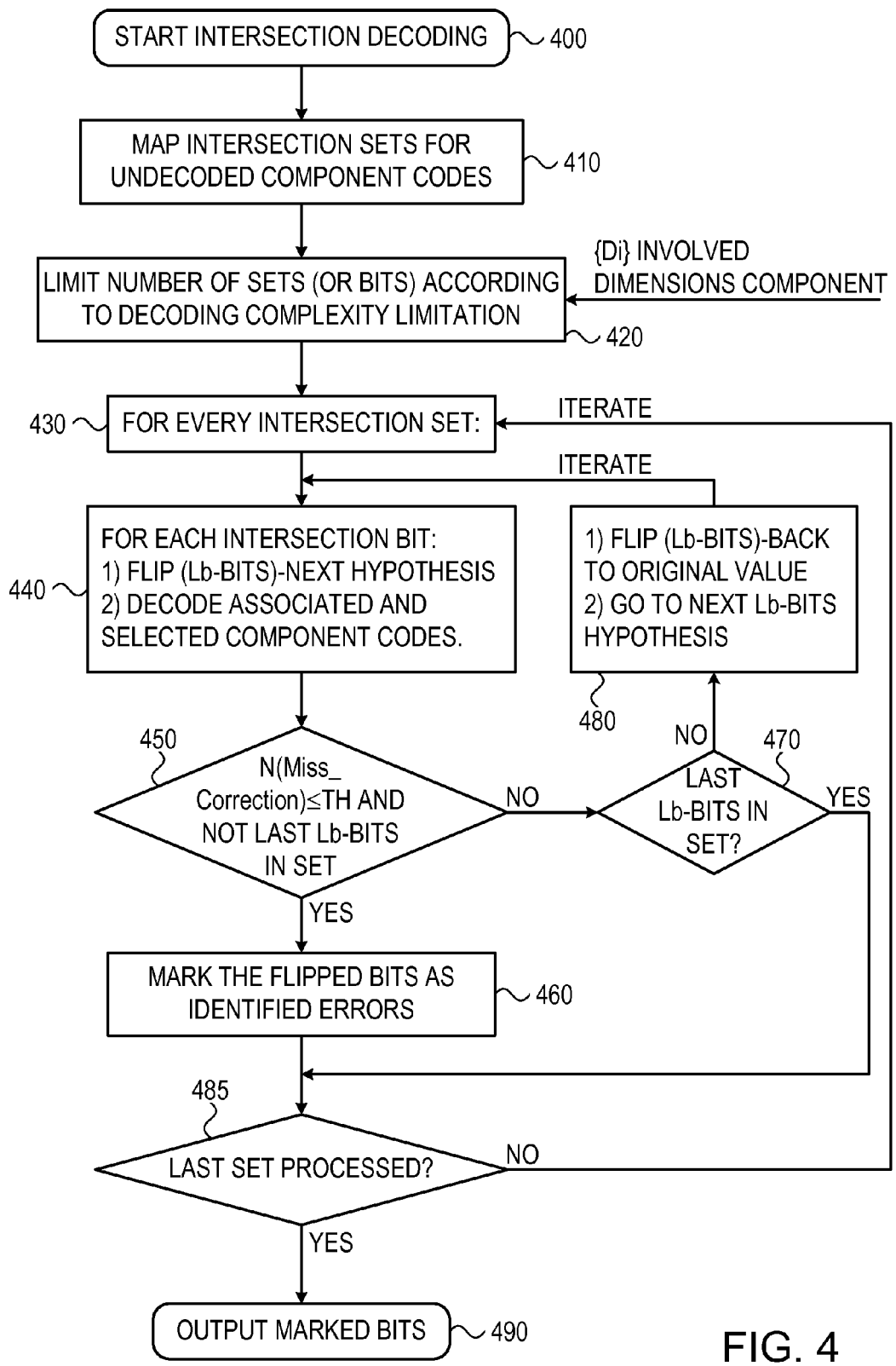
FIG. 4 is a flowchart of an intersection decoder according to an embodiment of the invention.

The intersection decoder may decode intersection bits 216-220, for example, as described in reference to FIGS. 3 and 4.

It may be appreciated that the data structures, dimensions of code, numbers or lengths of component codes, redundancy bits and encoders/decoders used are examples provided for demonstration and that other such configurations or variations thereof may be used.

Hard Decoding of Multi-Dimensional Codes

Reference is made to FIG. 3, which is a flowchart of a method for iterative hard decoding of multi-dimensional encoded data according to an embodiment of the invention.

In operation 300, a hard decoder (e.g., decoder 120 of FIG. 1) may initiate a hard decoding process. The decoder may decode a set of multi-dimensional codes (e.g., code 200 of FIG. 2) in which every input bit may be encoded by multiple component codes (e.g., where the number of component codes is equal to the number of multiple dimensions). The decoder may decode each of the multiple component codes in each separate dimension or in combinations of multiple (folded) dimensions. The codes need not be symmetric and a plurality of different codes with the same or different (irregular) length(s) or number(s) of redundancy bits may be used in each dimension.

In operation 310, the decoder may decode the "outer" codes of the first dimensional (D1) data stream (e.g., data stream 204 of FIG. 2) to generate encoded data bits. The outer codes may refer to the component codes used for the $1^{st}$ dimension of the multi-dimensional codes. In some cases, decoding the outer codes may sufficiently correct the data stream.

If the outer codes are decoded reliably, for example, where all (or an above threshold number of) errors on information bits are corrected by the outer code components, the decoding process may end without further decoding iterations and proceed to operation 390. It may be common for the decoded data to include only a few errors, when only a partial sub-set of codewords are read from a source data memory (e.g., a flash memory). A decoding success for an outer codeword may be determined by various mechanisms. In one example, the data of each outer-codeword (or for all outer codewords together) may contain cyclic redundancy check (CRC) bits, which may be checked. In one example, using BCH codes (e.g., parameterized error-correcting codes), a miss-correction in BCH code may be determined during the Chien-search phase of the decoder.

When applying multiple decoding processes, the decoder may initially perform an outer decoding process alone. Outer decoding may retrieve only a part of the source data to reduce processing latency.

If an outer decoding process fails, for example, some outer component decoder indicated a miss-correction, the decoding process may proceed to any or all of subsequent operations 320-360 or 380 for further decoding.

In operation 320, the decoder may use an iterative decoder to decode data bits, for example, generated in operation 310. An iterative decoder may be referred to as an "iterative turbo decoder" executing an iterative turbo decoding process. If an iterative decoder decodes reliably, for example, if a number of output errors detected is below a predetermined error threshold, the decoder may proceed to operation 390. Otherwise a process or decoder may proceed to operation 330.

In operation 330, the decoder may decode bits using majority decision decoding. Majority decision error correction may determine whether or not to modify each information bit based upon a majority or threshold level of indications associated with the information bit. Majority decision decoding may include a first decoding pass that marks the locations of each suggested correction in each of the multiple dimensions, but does not apply the suggested corrections to the input stream. The number of component codes that suggest each correction may be saved, for example, in a separate buffer for each suggested correction. Since the codes are multi-dimensional, every input bit may be encoded by multiple codes (e.g., the number of codes is equal to the number of dimensions). Therefore, a correction (e.g., a bit-flip from 0 to 1 or 1 to 0) may be applied if the same errors are found in the encoded data in a majority or an above threshold number of dimensions of the multiple dimensions. For example, the correction may be applied if a majority of component decoders or more than a certain threshold of decoders (e.g., not necessarily the majority of decoders) suggest the same correction. Applying corrections suggested by a majority of component decoders may increase the reliability of corrections, and decrease the incidence of false miss-corrections.

In operation 340, the decoder may decode bits using (t−1) limited corrections per component code. The decoder may correct up to a predetermined maximum number of (≤t−1) errors, where the predetermined number is defined by a reliability threshold. The maximum number of errors may be one (1) error less than the code correction capability (t). For a component code with some $D_{min}$, the correction capability may be, for example, $$t = \frac{D_{min} - 1}{2}.$$

To increase the probability of reliable correction, a few iterations may be executed, each of which corrects less than t errors. Each component code may have a code spectrum, which may be utilized to correct up to (t−1) errors. A probability distribution may be P(n,e) where 0≤n≤t may be the number of false errors detected after decoding the component code and e may be number of input errors (e>t). After decoding a component code with e>t, there may be $P_n(m)$ additional errors, where $$P_n(m) = \sum_{e=t+1}^{N} P(m, e)$$

and N is the codeword length (e.g., including parity bits) of the component code, and where m is a number of corrections per component code. Thus, the restriction to m corrections per component code may change in each iteration with an increasing false correction probability.

Operation 330 (majority decoding) and operation 340 ((t−1)-limited decoding) may each be carried out for respective numbers of iterations, $M_0 \geq 0$ and $M_1 \geq 0$. It may be noted that if $M_0 = 0$, there may be no majority decoding iterations and if $M_1 = 0$ there may be no (t−1)-limited decoding iterations. Embodiments of the invention may skip a decoding stage for example for faster decoding. In some embodiments, a decoder may mark decoded data as reliable and may reject suggested corrections to alter the marked reliable decoded data as false corrections.

In operation 350, the decoder may use an iterative decoder to decode bits, for example, generated in operation 330 or 340. The basic iterative hard decoding iteration may attempt to decode the data stream of bits for each component code.

Iterative decoding in operation 350 differs from iterative decoding in operation 320, for example, by decoding different input data. For example, the number of errors or complexity of the input from operation 310 may be greater than the maximum number of errors of complexity of the decoder in operation 320, while operations 330 or 340 may reduce the number of errors to generate input having a number of errors of complexity that the decoder in operation 320 may completely correct. If iterative decoder decodes reliably, the decoder may proceed to operation 390. Otherwise, if the decoder does not progress and the same errors detected in previous iterations are again detected after a predetermined number of decoding iterations, a process or decoder may proceed to operation 360.

In operation 360, if errors for input bits (e.g., error bits 212 of FIG. 2) are found in at least one dimension (e.g., error bits 214 of outer dimension stream 204 of FIG. 2) of the multi-dimensional code, the decoder may decode the corresponding intersection bits for the same input bits in higher dimensions (e.g., intersection bits 216-220 of inner dimension streams 206-210 of FIG. 2). In some embodiments, the intersections decoding may have a complexity limit so that no more than a predetermined maximum number of bits may be corrected in each iteration. The intersections decoding may be executed if, after previous decoding correction iterations, there are any or an above threshold amount of decoder components with errors (for example, missCorrection=1).

If the decoder decodes the intersections reliably, the decoder may proceed to operation 390. Otherwise a process or decoder may proceed to operation 350 or 370.

In operation 370, the decoder may reorder the dimension data from intersections decoding in operation 360. The decoder may receive a stream of decoded (and corrected) intersection bits, which may include (e.g., {I2, I1, Outer} dimensions), reordered or listed together from different dimensions (e.g., $1^{st}$, $2^{nd}$ and $3^{rd}$ dimensions, respectively). Since the ordering of the dimensions of data may be important for correct decoding, the ordering of the decoded intersections bit-set may be corrected prior to proceeding to further decode the information bits. Dimensions reordering may reset the decoder so that repeating operations (e.g., 330-370) on subsequent iterations may decode data with higher complexity or dimensions.

For further processing, a process or processor may proceed to operation 330 or 340 (e.g., if a number of errors detected is greater than a first predetermined error threshold), operation 380 (e.g., if the number of errors detected is greater than the first, but less than a second predetermined error threshold), and/or to operation 390 (e.g., if the number of errors detected is less than the second predetermined error threshold).

In operation 380, the decoder may decode using an enhanced iterative decoder. The enhanced iterative decoder may correct additional errors by changing bit values for each component code to generate a total or (t) corrections per component code (e.g., increasing the (t−1) limited corrections per component code by (1) correction). If the enhanced iterative decoder decodes reliably, the decoder may proceed to operation 390. Otherwise a process or decoder may proceed to operation 385.

In operation 385, the decoder may fail, for example, generating bits having an above threshold error level. The decoder may output the erroneous bits, no bits or an error message.

In operation 390, the decoder may succeed, for example, generating bits having a below threshold error level. The decoder may output a decoded version of the data input in operation 300.

Reference is made to FIG. 4, which is a flowchart of an intersection decoder according to an embodiment of the invention. Intersection decoder may decode (and correct) multi-dimensional code (e.g., N-dimensional code 200 of FIG. 2) at bits intersecting erroneous bits (e.g., erroneous bits 214 of FIG. 2).

In operation 400, a decoder (e.g., decoder 120 of FIG. 1) may initiate an intersection decoding process.

In operation 410, the decoder may detect erroneous bits having an error detected (e.g., missCorrection=1) and may map the erroneous bits (e.g., erroneous bits 212 of FIG. 2) to the corresponding locations at intersection bits in other dimensions (e.g., intersection bits 216-220 of FIG. 2).

In operation 420, the decoder may limit the number of intersections bits or the size of each bit set, for example, according to the decoding complexity limit. The decoder may determine the dimensions, Di, for which intersections decoding may be applied. In various embodiments, intersection bits may be decoded on all or only a sub-set of dimensions. In one example, intersection bits may be decoded for inner codes, one dimension at a time, until one or more predetermined number of errors (e.g., missCorrection=1) are verified.

In operation 430, for every set of intersection bits, the process or decoder may proceed to operation 440.

In operation 440, for each intersection bit, the decoder may flip or invert $L_b$-bits, for example, changing bit values from 0-bits to 1-bits and/or 1-bits to 0-bits, and may decode the associated component codes for the flipped bits. Flipped $L_b$-bits may be a sub-set of the intersection bits of a predetermined number of bits. The predetermined number of flipped bits, $L_b$, may be determined by the enumeration complexity, which may have an upper bound of $(L_b)^{Nb}$, where $L_b$ is the number of bits in a single bit-set intersection, and $N_b$ is the number of enumerated bits, which corresponds to the number of flipped bits in the intersections decoding process.

For every selected intersection set enumerated over the intersection bits, every time another bit (or bits) is inverted or flipped, the decoder may attempt to decode the corresponding component codes on the selected dimensions. This may enable correcting $t+N_b$ errors on a single component code.

In operation 450, the decoder may determine if the number of detected errors (e.g., bits with missCorrection=1) is less than or equal to an error threshold and if the flipped $L_b$-bits are the last bits to flip in the intersections bit-set. If both conditions are met, a process or decoder may proceed to operation 460. Otherwise, a process or decoder may leave the flipped bits unmarked and may proceed to operation 470.

In operation 460, the decoder may mark the flipped bits as identified errors.

In operation 470, the decoder may determine if the flipped $L_b$-bits are the last bits to flip in the intersections bit-set. If yes, a process or decoder may proceed to operation 485. Otherwise, a process or decoder may proceed to operation 480.

In operation 480, the decoder may flip the $L_b$-bits flipped in operation 440 back to their previous or original values and may proceed to the next hypothesis or combination of $L_b$-bits to flip. In one example, if the number of bits to flip, $L_b$, is k, and there are n intersection bits, then there may be a total of $$\frac{N!}{(N-K)!K!}$$

hypotheses or combinations, where K is the number of flipped bits ($L_b$) and N is the number of intersection bits. A process or decoder may proceed to operation 440 to flip intersection bits according to the next hypothesis or $L_b$-bit configuration.

In operation 485, the decoder may determine if the intersection set in the currently completed iteration of operation 430 is the last interception of component codes in the multi-dimensional input code. If no, a process or decoder may proceed to operation 430 with the next intersection set. If yes, a process or decoder may proceed to operation 490.

In operation 490, the intersections decoder may output bits marked as errors in operation 460 for all intersection sets. The decoder may the continue to iteratively decode the component codes until all information bits errors are resolved, for example, as described in reference to FIG. 3.

According to an embodiment of the invention, all component codes may be used to determine the list of intersections, while the actual decoding with enumeration of error hypothesis may be executed on some or all associated component codes. For example, intersections decoding may be executed using component codes in as few as two, and less than all, of the multiple dimensions of the code. Decoding in a sub-set of dimensions may reduce computational complexity.

Other operations or orders of operations may be used.

Soft Decoding of Multi-Dimensional Codes

Soft decoding relates to the decoding soft inputs (uncertain bit values and their probabilities) and providing hard output (definite bit values) associated with the corrected information bits.

A soft decoder (e.g., decoder 120 of FIG. 1) may decode a component code (e.g., also referred to as a "packet") using soft information for each bit. The soft decoder may generate the soft bit information or values by performing multiple reads from a source memory, such as, as flash memory, where each read operation uses different read thresholds, for example, as described in reference to FIG. 14. The soft decoder may use read thresholds to compute "soft" values, such as, log-likelihood ratio (LLR), for each bit. The log-likelihood ratio (LLR) for a bit (i) may be defined, for example, as follows:

$$LLR(b_i) = \log\left(\frac{P(b_i = 1 | y)}{P(b_i = 0 | y)}\right)$$

where $b_i$ is the $i^{th}$ bit of some data source and y is the channel output. The LLR expression may be simplified, for example, for an additive white Gaussian noise (AWGN) channel model. The AWGN channel model may be a good approximation in many cases for the flash threshold voltage distribution (e.g., threshold voltage distribution 1400 in FIG. 14). By assuming the following for an AWGN channel, $$P(b_i | y) = \frac{1}{\sqrt{2\pi\sigma^2}} \exp\left(-\frac{(y - b_i)^2}{2\sigma^2}\right)$$

where y is the AWGN channel output, the LLR for bit (i) may be simplified, for example, to:

$$LLR(b_i) = \frac{2y}{\sigma^2}$$

where the soft decoder may generate the LLR per bit during the multiple reads from the memory source, for example, as a quantized version of an AWGN channel. The quantization level per threshold may be directly determined by the number of reads, for example, as a base-two logarithm of the read counter. Once the soft decoder executes the multiple reads and generates the soft bit information (e.g., LLRs) for all codewords bits, the soft decoding process may proceed.

Iterative soft decoding may include soft decoding one or more component codes (e.g., including hard bit values and soft bit values) to generate a plurality of candidate error corrections. Each candidate may suggest hard bit changes to the component codes (e.g., to flip one or more bits or no bits for a trivial correction). Each candidate may be associated with corresponding soft bit value changes, for example, defining a probability that the component code is valid when the suggested change of the candidate is applied. Since different candidates generate different codewords, different candidates may be associated with different (or the same) soft bit probabilities. Embodiments of the invention may exploit the soft bit information by reducing the list of all possible corrections to only evaluate a sub-set of candidate corrections associated with soft bit information indicating the greatest codeword probabilities of validity.

Soft decoders may decode single dimensional encoded data (e.g., having a single version of encoded data for each original input bit) or multi-dimensional encoded data (e.g., having multiple versions of encoded data for each original input bit in the multiple different dimensions). When multi-dimensional decoders are used, the decoder may iteratively soft decode the different versions of the same data in each incremental dimension to iteratively refine errors, for example, until a minimum or below threshold probability of errors remain in the encoded data. An example for a multi-dimensional code (e.g., multi-dimensional code 200 of FIG. 1) may be a 3D code that includes outer component codes (e.g., BCH codes) which correct an integer number of errors, for example, t>4 errors. If the code has inner-1 and inner-2 component codes with decoding capability of t≤4, then soft decoding may correct any number of errors with an efficient decoder implementation (e.g., at low decoding latency).

Soft decoding may include, for example:

Operation (1): A soft decoder may sort component indices according to a measure of the certainty of bit values (soft bit reliability/probability), for example, from the least reliable to the $N^{th}$ least reliable bit.

Operation: (2) The decoder may determine the enumeration complexity or the maximum number, t, of bits corrected or flipped from the original input bits for each of a plurality of candidate or hypothesized error corrections. The decoder may generate a list of the plurality of candidate error corrections for each component code and may order the candidate error corrections for evaluation. The decoder may map reliability values (e.g., soft bit values, such as sum-LLR scores) associated with each bit of each candidate to a uniform finite scale. The combined reliability values of the bits of each candidate, for example, arranged in a uniform finite scale an integer grid, may be simply sorted in a monotonically changing (e.g., non-decreasing or increasing) order. The candidates may be ordered according to the order of their associated combined reliability values to create a list of candidates to be decoded in order of their reliability.

Operation (3): The decoder may hard decode each candidate in their order in the list to invert or flip bits to generate an updated component code having updated hard bit values according to each candidate error correction's suggested hard bit values. In one example, if a (e.g., BCH) component code with correction capability of up to t<4 flipped bits is used, then decoding may be implemented at low complexity and low latency, e.g., without a Chien search.

Operation (4): The decoder may soft decode each candidate in their order in the list, for example, with a valid solution (missCorrection=0) to generate an updated component code having updated soft bit values. The decoder may compute soft bit information, for example, as the sum of the respective LLR values for each inverted (flipped) bit (sum-LLR).

Operation (5): The decoder may save a sub-set of valid candidates with the highest (or above threshold) probability of being valid or correct, for example, with the lowest sum-LLR (or the candidate list with the lowest sum-LLRs).

Figure 5:
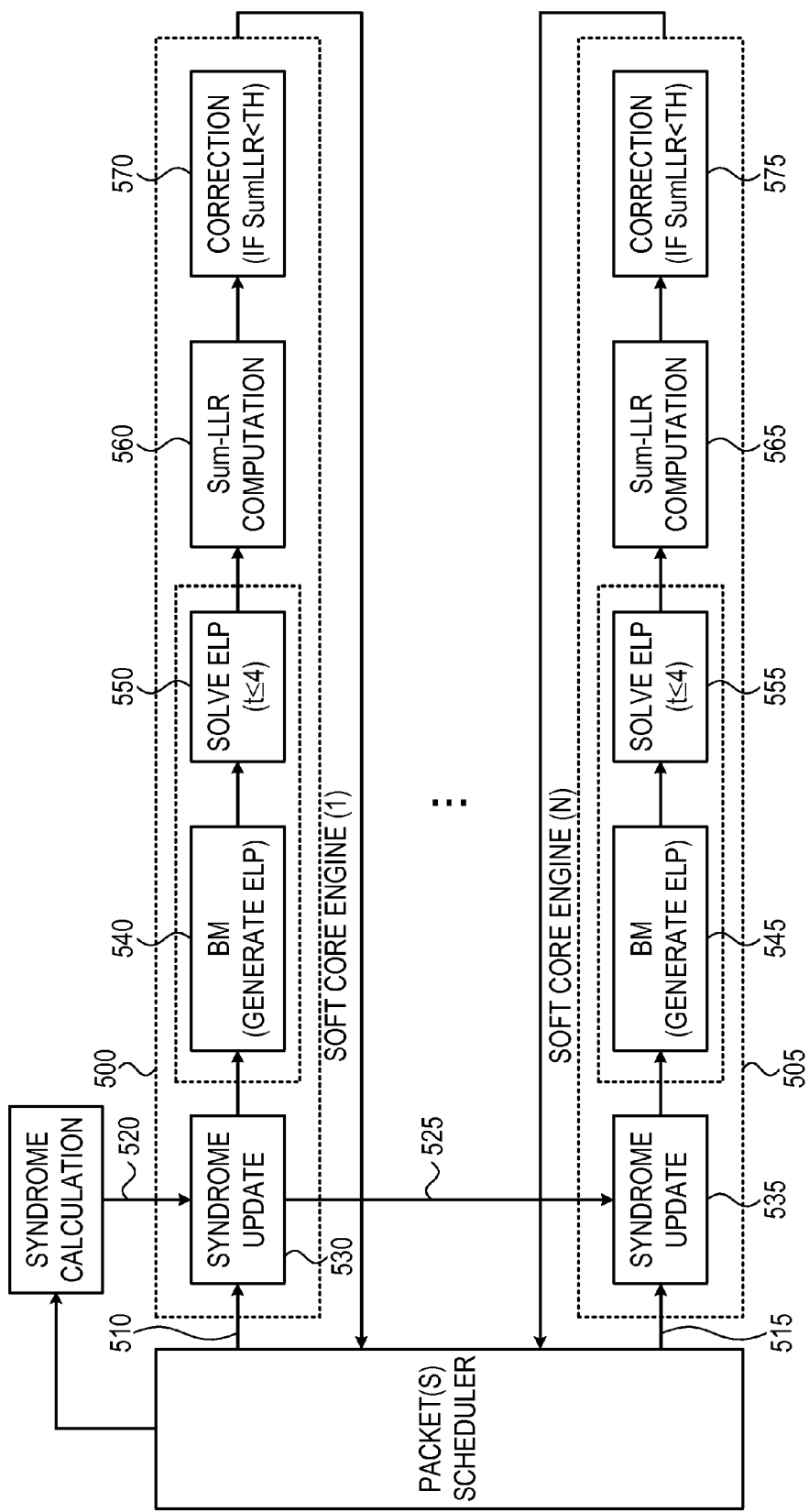
FIG. 5 is a flowchart of a method for soft decoding multi-dimensional encoded data according to an embodiment of the invention.

Reference is made to FIG. 5, which is a flowchart of a method for soft decoding multi-dimensional encoded data according to an embodiment of the invention.

Each of two or more operation sequences 500 and 505, for example, (N≥2) operation sequences may be executed by a different one of a plurality of (N) decoder engines (e.g., N decoders 120 of FIG. 1). Each different decoder engine may decode the same component code with a different candidate error correction. Alternatively, each different decoder engine may decode a different component code of the same dimension. In yet another embodiment, a single decoder engine may execute operation sequences 500 and 505, for example, one after another in consecutive computational cycles. Operation sequences 500 and 505 may proceed for example as follows:

In each of operations 510 and 515, the decoder engine may retrieve one or more packet(s) or component codes from a data input stream. The packet(s) may include encoded data potentially having errors. The encoded data may be single dimensional encoded data (e.g., where each of a plurality of input bits from a data structure are encoded once in a single dimension) or multi-dimensional encoded data (e.g., where each of a plurality of input bits from a data structure are encoded multiple times in multiple different dimensions).

In each of operations 520 and 525, the decoder engine may retrieve a syndrome calculation, for example, using BCH code or Hamming code, for the component codes retrieved by the decoder engines in operations 510 and 515, respectively. The syndrome calculation may be executed once for each component code. Every candidate error vector may be used to update the syndrome (e.g., which may be a relatively low complexity operation). Then, a solver may obtain zero (0) syndromes (e.g., indicating a successful correction) or may return a missCorrection (e.g., indicating a failed correction).

In each of operations 530 and 535, each decoder engine may include a syndrome update module to update the syndrome calculation for each packet according to a current error hypothesis or candidate being decoded in the respective operation sequences 500 and 505.

In each of operations 540 and 545, each decoder engine may generate an error locating polynomial (ELP), for example, using the Berlekamp-Massey (BM) or Euclidian algorithm.

In each of operations 550 and 555, each decoder engine may solve the error locating polynomial (ELP) generated in operations 540 and 545, respectively, for a candidate error correction that inverts or flips less than or equal to a predetermined number (e.g., t≤4) of bits from the original input bits. The decoder engines may solve each candidate error correction with such a maximum (e.g., t≤4) enumeration complexity.

In each of operations 560 and 565, for each candidate error correction with a valid solution (missCorrection=0), each decoder engine may compute the soft information probability of being a valid correction. The probability of being a valid correction may be computed using the combined or sum-LLR values of the error bits. Each bit (of group of bits) may have an LLR value. Each decoder engine may approximate a soft metric of a corrected codeword as, for example, the sum of absolute valued LLRs of the corrected bits (e.g., the sum of the LLR values of bits including those inverted according to the present hypothesis). The probability of being a valid solution may be inversely proportional to the sum-LLR (e.g., which is low for valid solutions and high for invalid solutions).

In each of operations 570 and 575, each decoder engine may determine whether or not to select and apply the correction of the respective hypotheses. In one embodiment, if the soft bit information associated with the hypothesis (e.g., sum-LLR, also referred to as "outLLR") is within a predetermined error threshold (e.g., the sum-LLR is greater than a threshold), the probability of being a valid solution is low and the correction of a hypothesis may be determined to be a false correction and may be rejected. Otherwise, if the soft bit information associated with the hypothesis is within a predetermined success threshold (e.g., if the sum-LLR is less than the threshold), the probability of being a valid solution is high and the correction of the hypothesis may be determined to be correct, and may be selected and applied to correct the code. The predetermined error and success soft bit thresholds may be the same or different thresholds.

The soft bit (e.g., sum-LLR) threshold(s) may be used in the iterative soft decoding process to minimize the false correction probability at the expense of higher latency decoding (by multiple iterations). The soft bit threshold (e.g., denoted by LLR_TH(iterCounter) in Table 1) may be slightly increased in each iteration, for example, to allow an increasing number of corrections to be applied in each iteration, while minimizing false corrections.

In order to increase the convergence rate of the iterative soft decoder with increasing soft bit thresholds, the decoder engine may use a set of fast increasing soft bit thresholds for LLR_TH(iterCounter). In cases of unsuccessful decoding after a maximal number of iterations, the decoder engine may repeat or iterate the process with a different set of relatively slower increasing soft bit thresholds LLR_TH(iterCounter). Such embodiments may reduce the average number of iterations for soft decoding to decrease power consumption for hardware implementations.

According to an embodiment of the invention, the soft bit threshold (LLR_TH) may change as a function of the iteration counter of the decoder engine and according to the decoded component code. That is, a vector of LLR_TH may be designated to every type of code component in multi-dimensional code, for example, where the components may differ by their length, correction capability, Galois field size, etc. The different types of component codes may belong to the same dimension or to different dimensions.

According to an embodiment of the invention, the soft bit threshold (LLR_TH) may depend on the working point signal-to-noise ratio (SNR) of the decoder. For example, the sum-LLR threshold may be proportional to $\sqrt{SNR}$, which approximately corresponds to the LLR values scaling.

Table 1 shows an example of sum-LLR thresholds for each iteration count (i) of decoding. Each iteration count (i) may use a different set of sum-LLR thresholds for every code dimension of a (e.g., 3D) code. Table 1 shows a single sum-LLR threshold used to decode all component codes for each different combination of dimension and iteration. Such embodiments may be used for regular 3D codes. However, for irregular 3D codes, there may be a larger set of thresholds, for example, according to the iteration number and/or component code parameters such as the correction capability and/or the component code length. Each row of values in Table 1 may define the threshold set for a given iteration.

TABLE 1

An example of sum-LLR threshold configuration for a set of 3D code

| Iteration Count (i) | LLR_TH(D1) | LLR_TH(D2) | LLR_TH(D3) |
|---|---|---|---|
| 1 | $\sqrt{SNR} \cdot 1.5$ | $\sqrt{SNR} \cdot 2$ | $\sqrt{SNR} \cdot 2.5$ |
| 2 | $\sqrt{SNR} \cdot 2$ | $\sqrt{SNR} \cdot 2.4$ | $\sqrt{SNR} \cdot 3$ |
| 3 | $\sqrt{SNR} \cdot 2.5$ | $\sqrt{SNR} \cdot 2.8$ | $\sqrt{SNR} \cdot 3.5$ |
| 4 | $\sqrt{SNR} \cdot 3$ | $\sqrt{SNR} \cdot 3.2$ | $\sqrt{SNR} \cdot 4$ |
| 5 | $\sqrt{SNR} \cdot 3.5$ | $\sqrt{SNR} \cdot 3.6$ | $\sqrt{SNR} \cdot 4.5$ |
| 6 | $\sqrt{SNR} \cdot 4$ | $\sqrt{SNR} \cdot 4$ | $\sqrt{SNR} \cdot 5$ |
| ... | ... | ... | ... |

Figure 6:
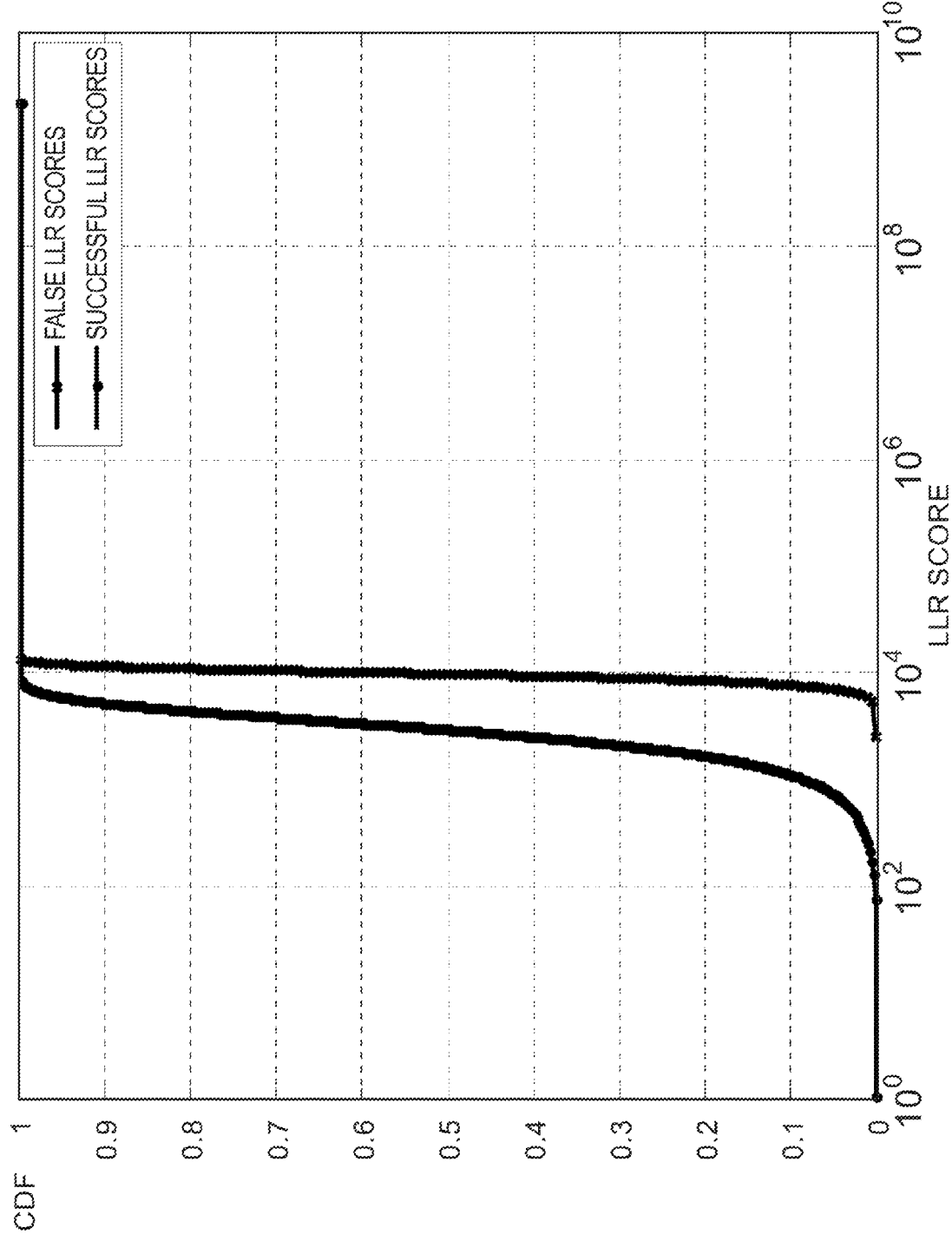
FIG. 6 is a graph of the probability of successful and false corrections for different soft bit threshold scores according to an embodiment of the invention.

An example of LLR threshold scores are shown in FIG. 6.

FIG. 6 is a graph of the probability of successful and false corrections for different soft bit threshold scores according to an embodiment of the invention. In FIG. 6, cases for successfully correction of errors (successful LLR scores) are distinguished from cases which may perform false corrections (false LLR scores). The soft bit values or scores in the example of FIG. 6 are sum-LLR values of the soft component decoder defined as, $$\text{score} = \sum_{i=1}^{P} |LLR(b_i)|,$$

where P denotes the number of error bits and $b_i$ denotes the error bit location. A soft bit threshold may be set such that the probability of false correction is exactly (or approximately) a predetermined value or range. The soft bit threshold may define the maximum allowable soft bit scores according to the desired ratio of false and successful corrections. In one example, if the soft bit threshold is set (e.g., LLR_TH=$10^3$), then the allowable soft bit scores of the soft component decoder may be limited to be within that threshold. In FIG. 6, soft bit (LLR) scores less than ($10^3$) have a false correction probability of approximately zero and the successful correction probability of approximately 0.1. Therefore, all soft decoding corrections with soft bit (LLR) scores below this threshold may be valid corrections and therefore the associated soft bit information may be modified to indicate a maximum probability of validity (e.g., a minimum sum-LLR). In the example of FIG. 6, the probability distribution of soft bit scores is defined for a component codes of length 1 k Bits at a desired working point (e.g., input error probability).

Once a hypothesis or candidate error correction is selected to correct a component codeword (e.g., based on soft bit thresholds), the suggested hard bit values of the hypothesis may be applied to the component codeword. In addition to updating hard bit values, the soft decoder may update the soft bit information of the component codeword (e.g., the sum-LLR scores).

According to some embodiments of the invention, if the updated soft bit information of the component codeword is within a second threshold, the soft decoder may "clip," re-set or "boost" the soft bit information of the component codes corrected to bypass or override soft decoding in subsequent iterations (e.g., dimensions). In one embodiment, soft bit values may be modified to the highest possible reliability values, such that every modified soft correction is accepted. Such embodiments may allow the decoder to correct even low probability error events, for example, after most corrections have already been applied, with low false correction probability. There may be several possible modifications and conditions. In one example, the decoder may boost the reliability values for component codes that already have substantially high (above threshold) soft bit reliability metrics (e.g., probabilities of validity), for example, to a maximum value. In another example, the decoder may boost the reliability values for some or all component code to increase decoder speed (at the expense of accuracy). When the soft metric is a sum-LLR value or score, a maximum reliability metric may be defined by a minimum sum-LLR value associated with the optimal candidate for each component code. The decoder may modify the LLR values of the component code by overriding the LLR value associated with each data bit in the component code to a predetermined high absolute value (e.g., corresponding to soft bit information LLR values) while retaining the sign of the LLR value (e.g., corresponding to the hard bit value, for example, positive for a 1 value and negative for a zero bit value). In other embodiments of the invention, any number of modified reliability metrics may be used, for example, which are uniformly spaced on a uniform finite scale such as an integer grid. A corresponding number of threshold ranges may be used to map original reliability metrics in each range to a corresponding one of the multiple modified reliability metrics. Increasing reliability metrics may cause more candidates to be accepted, while decreasing reliability metrics may cause fewer candidates to be accepted.

In one embodiment, if the probability that a candidate error correction is valid is greater than a threshold, the decoder may re-set the soft bit probability to a predetermined maximum probability of validity indicating the hard bit information values for the input bits have a relatively high or maximum probability of being correct. For example, the decoder may replace each soft bit (LLR) value for a component code with a predetermined maximum soft bit (LLR) value, for example, denoted by MAXLLR, while keeping the original LLR sign:

$$llr(b_i) = \text{sign}(llr(b_i)) \cdot \text{MAXLLR}$$

The decoder may increase the LLR scores of code correction hypotheses with sufficiently low probabilities of false correction (e.g., with sum-LLR<clipping threshold) to predetermined LLR score(s) (e.g., MAXLLR).

According to an embodiment of the invention, the soft bit values may be modified only up to a predetermined maximum iteration count. In one embodiment, when a decoding iteration count is larger than a certain threshold, no further soft bit information modification may be performed (e.g., on any or a sub-set of code components).

According to an embodiment of the invention, another criterion for modifying or "boosting" soft bit information may be the convergence of soft bit information. In one example, the decoder may modify or change soft bit information if the difference or "distance" in soft bit information, $S_{dist}$, for example, between hypotheses with the largest probabilities of error (e.g., between an optimal score and a closest to optimal score) is below a predetermined threshold. When multiple hypotheses with the largest probabilities of error are sufficiently close, there is high certainty that the hypothesis with the largest probability is correct. This hypothesis may be selected and applied to the component codeword and the soft bit information of the codeword may be modified to indicate a maximum probability of validity.

In one embodiment, the soft information distance may be an LLR distance, $S_{LLR\text{-}dist}$, for example, between the two smallest LLR scores (or their ratio) of a code component decoder. In one embodiment, the LLR distance for the suggested correction may be given by, for example:

$$S_{LLR-dist} = S_{min\,2} - S_{min}, \qquad (1)$$

where $S_{min}$, $S_{min\,2}$ are the smallest and second smallest LLR scores (having the highest and second highest error probability) generated by the component decoder, respectively. When this soft bit information (LLR) distance score is below a predetermined threshold, the soft bit (LLR) scores converge, and the reliability for the candidate correction using the hypothesis associated with a minimum soft bit score, $S_{min}$, is sufficiently high.

In another embodiment, the LLR distance for the suggested correction may be given by, for example:

$$S_{LLR-dist} = \frac{S_{min2}}{S_{min}} \qquad (2)$$

Either or both the soft bit information distances in equations (1) and/or (2) may be used to determine whether or not to modify or clip soft bit information. Other or different equations may be used. The soft bit information distance score $S_{dist}$ may be used alone, or in addition to score for the probability of false correction (e.g., sum-LLR score), to determine whether or not to perform soft information clipping. Any combination of these scores may be used depending on the code performance and design requirements.

Figure 7:
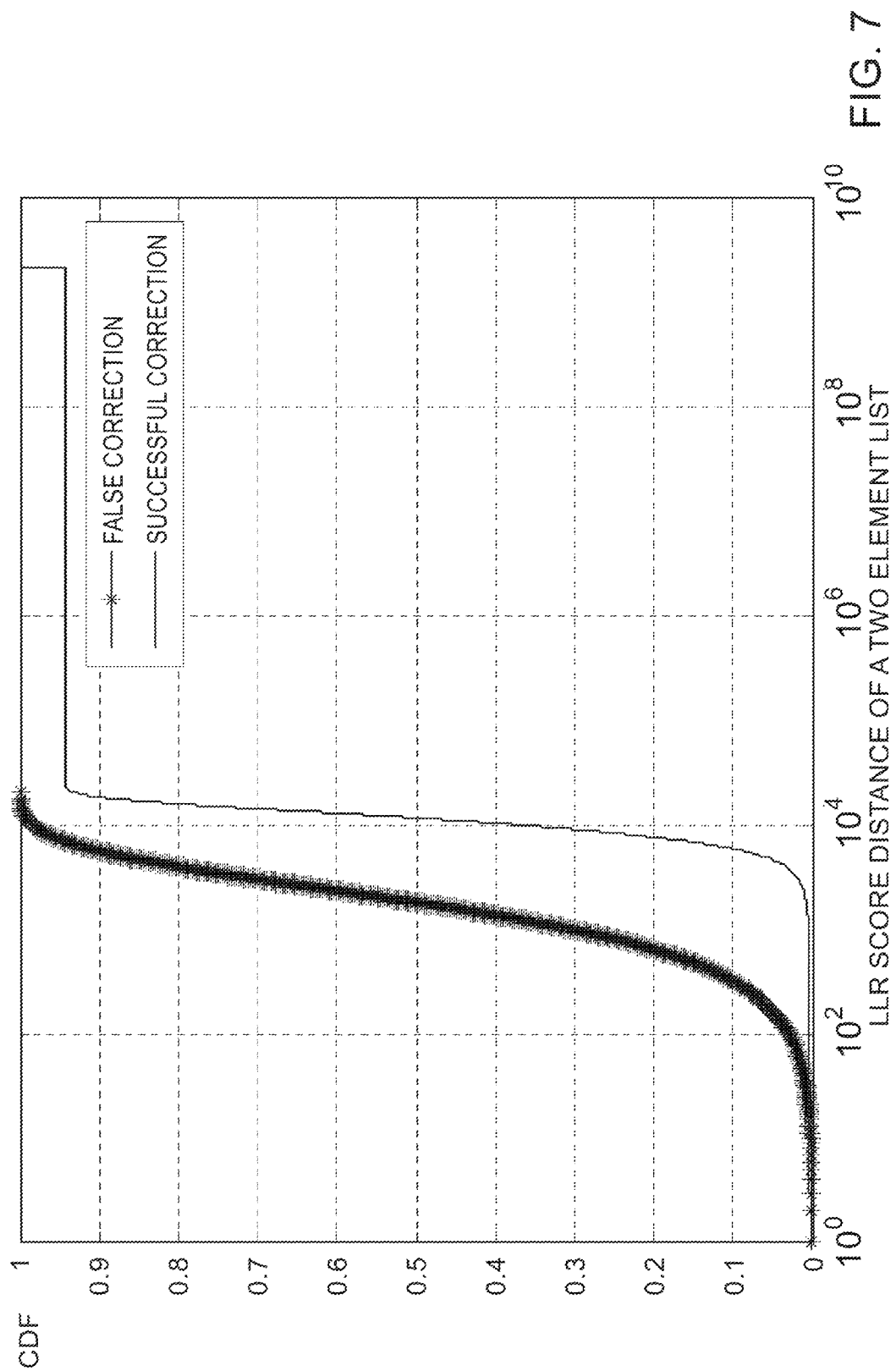
FIG. 7 is a graph of the probability of successful and false corrections for different distances between the soft bit scores of the smallest and next smallest soft bit scores for a code component according to an embodiment of the invention.

Reference is made to FIG. 7, which is a graph of the probability of successful and false corrections for different distance between soft bit (e.g., LLR) scores of the smallest and next smallest scores for a code component according to an embodiment of the invention. In the example in FIG. 7, the soft bit scores measure the distances between the smallest and next smallest LLR scores for a component code (of size 1 Kbits). FIG. 7 shows that if a threshold of 5e+3 is used for the distance score, $S_{LLR-dist}$, then the decoder generates only 10% of potential false corrections and 97% of potential successful corrections. It may be appreciated that this threshold and the LLR_TH may be jointly adapted to specific code component parameters and to the iteration number to provide optimal error correction performance.

Clipping soft information may re-set soft bit values or scores to a predetermined value, for example, associated with high reliability. According to another embodiment of the invention, instead of re-setting soft bit information to a predetermined value, the soft bit information may be scaled by a scaling function. In some embodiments, if the probability that a candidate error correction is valid is greater than a threshold, scaling may increase the soft bit information probability to indicate a relatively higher or maximum probability of validity. For example, the soft bit information may be scaled by scaling the soft bit values or scores to an above threshold probability indicating the hard bit information values are valid. In one example, when using LLR values for soft bit information, the decoder may scale the LLR values as follows:

$$llr(b_i) = llr(b_i) \cdot s(\text{iterCounter}, c)$$

where $s(\text{iterCounter}, c)$ may be the scaling factor as function of the iteration counter, denoted by iterCounter, and the code component, denoted by c. A bit with a low or zero |LLR| value may have a high probability of being an error and a bit with a high |LLR| may have a high probability of being a reliable or valid bit. The scaling factor $s(\text{iterCounter}, c) > 1$ may increase the |LLR| values or reliability of bits with substantially high or above threshold LLR values. As decoding iteration progress, iteratively scaling LLR values may strengthen the reliability of bits that have a relatively high predetermined probability of being correct. The dependency of the scaling factor on the component code may reflect the difference in correction reliability of different components in different dimensions (or in the same dimension for irregular multi-dimensional folded codes).

In some embodiments, the soft decoder may reverse the modified soft bit information to indicate the initial soft bit information. Reversing the soft bit information may revert the probability for the candidate error correction to the initial probability but may retain (or revert) the modified hard bit values for the selected candidate error correction. Reversing the soft bit information may return the absolute value of the LLRs of the candidate error correction bits to their original values in the soft bit information, but retaining the hard bit values may keep the sign of the LLRs of the bits of the candidate error correction in the soft bit information.

According to some embodiments of the invention, a soft decoder may decode or enumerate each likely candidate error corrections or hypotheses for each component code (for example, the ($k^{th}$) hypothesis in a list, Lvec) of a plurality of a sub-set of a set of all potential error corrections for the component code and may discard or ignore the remaining sub-set of least reliable hypotheses. For example, to enumerate over s-bits, the decoder may start by inverting hypotheses having the greatest probability of being valid (e.g., with the smallest sum-LLRs). The following pseudo code describes an example of enumeration ordering.

```
/* t+1 error correction - flip one suspected erroneous bit */
for( indices[0] = 0 ; indices[0] < errorSpan[0] ; indices[0]++ )
    softDecoderRoutine(indices[0]);
/* t+2 error correction - flip two suspected erroneous bit */
for( indices[0] = 1 ; indices[0] < errorSpan[0] ; indices[0]++ )
    for( indices[1] = 0 ; indices[1] < min(indices[0], errorSpan[1]) ;
    indices[1]++ )
        softDecoderRoutine(indices[0], indices[1]);
/* t+3 error correction - flip three suspected erroneous bit */
for( indices[0] = 2 ; indices[0] < errorSpan[0] ; indices[0]++ )
    for( indices[1] = 1 ; indices[1] < min(indices[0], errorSpan[1]) ;
    indices[1]++ )
        for( indices [2] = 0; indices[2] < min(indices[1], errorSpan[2]) ;
        indices[2]++ )
            softDecoderRoutine(indices[0], indices[1], indices[2]);
/* t+4 error correction - flip four suspected erroneous bit */
for( indices[0] = 3 ; indices[0] < errorSpan[0] ; indices[0]++ )
    for( indices[1] = 2 ; indices[1] < min(indices[0], errorSpan[1]) ;
    indices[1]++ )
        for( indices[2] = 1 ; indices[2] < min(indices[1], errorSpan[2]) ;
        indices[2]++ )
            for( indices[3] = 0 ; indices[3] < min(indices[2],errorSpan[3]) ;
            indices[3]++ )
                softDecoderRoutine(indices[0], indices[1], indices[2],
                indices[3]);
```

Other code or operations may be used. The vector "indices" may include pointer indices for a decoder component, which may also be ordered according to their likelihood. That is, the first index may point to the location of the bit with the smallest index of the code component, the second index may point to the location of the bit with the second smallest index of the code component, etc.

According to another embodiment of the invention, the list of candidate error corrections or hypotheses may be generated such that hypotheses are ordered to have associated soft bit reliability values or scores that are monotonically changing (e.g., monotonically non-decreasing sum-LLR values). If the soft bit reliability scores of the candidate error corrections (as ordered in the list) are monotonically changing, the same single enumeration span limit may be used for all candidates in the list. Accordingly, the list may be created without being limited by the number of bits per candidate error correction. However, partial sum ordering for all candidates in the list is typically an NP-complete problem, for example, having prohibitively high implementation complexity.

According to an embodiment of the invention, the soft bit (e.g., LLR) values may be mapped, for example, onto a linear, equally spaced, grid. The mapped values may be used to sort the list (e.g., using an enumerator). However, when evaluating the soft bit values of a candidate and its corresponding code solution, the original soft bit values (e.g., not the mapped values) may be used. Ordering candidates in the list may be simplified to sorting bounded integer candidate values in a monotonic (e.g., non-decreasing) partial sum ordering, which has, for example, a linear time complexity (significantly less complex than the exponential time complexity of conventional systems). Accordingly, embodiment of the invention may order candidates in the list efficiently, for example, in linear time.

An example of generating an ordered list of candidate error corrections is provided as follows.

The input into the enumerator may be, for example, a set of five candidate bits denoted as A, B, C, D, and E (e.g., enumeration span=5) having the lowest associated LLR values. Each combination of different values (0 or 1) of one or more bits may be a different candidate error correction or hypothesis to correct the codeword ABCDE. In the example, three candidate bits have LLR values, LLRval=0, denoted by candidate bits A, B, and C, and two candidate bits have LLRval=1, denoted by candidate bits D, E. Example enumeration computations for the five candidate bits are shown in Table 2:

TABLE 2

Enumeration implementation example

| Candidate Bits | Candidate Bits Flipped in the Hypotheses | | | | |
|---|---|---|---|---|---|
| | A | B | C | D | E |
| Candidate Bit Values | 0 | 0 | 0 | 1 | 1 |
| Hypothesis No. ↓ | | | | | Initial LLR Sum ↓ |
| 1 | * | | | | 0 |
| 2 | | * | | | |
| 3 | | | * | | |
| 4 | * | * | | | 0 |
| 5 | * | | * | | |
| 6 | | * | * | | |
| 7 | * | * | * | | 0 |
| 8 | | | | * | 1 |
| 9 | | | | | * |
| 10-16 | All combinations similar to hypotheses 1-7 | | | * | 1 |
| 17-23 | All combinations similar to hypotheses 1-7 | | | | * | 1 |
| 24 | | | | * | * | 2 |
| 25-31 | All combinations similar to hypotheses 1-7 | | | * | * | 2 |

The example in Table 2 provides the following results:

$$SumLLR = 0 \text{ is obtained by } \binom{3}{1} + \binom{3}{2} + \binom{3}{3} = 7 \text{ hypotheses.}$$

$$SumLLR \text{ Sum} = 1 \text{ is obtained by } \left[\binom{2}{1} + \binom{2}{1}\right] * 7 = 16 \text{ hypotheses.}$$

$$SumLLR \text{ Sum} = 2 \text{ is obtained by } \left[\binom{2}{2} + \binom{2}{2}\right] * 7 = 8 \text{ hypotheses.}$$

In total, there are 31 hypotheses, $(2^5-1)$, where the order of the hypotheses may be defined according to their probability of producing a successful solution. Accordingly, limiting the size of a candidate or hypothesis list may preserve the candidate hypotheses with the greatest probability of success (e.g., preserving optimality performance) while decreasing the computational complexity associated with analyzing the candidates with the smallest probability of success.

According to some embodiments of the invention and, for example, in the pseudo code above, different bits may have different enumeration spans. In some embodiments, each bit suspected to be an erroneous bit may have a different span, for example, different error spans errorSpan[0], . . . , errorSpan[3] in the pseudo code above. The enumeration span values may be determined for every code component, for example, according to role of the component code in the multi-dimensional code structure. For a given multi-dimensional code, the decoder may compute a multi-curve graph for the operational signal to noise (SNR) working point for each component code to which soft decoding may be applied. The SNR may also be directly related to the uncoded bit error rate (UBER), for example, for an AWGN channel, for example as follows:

$$uber(SNR) = \frac{1}{2}\text{erfc}\left(\sqrt{\frac{SNR}{2}}\right)$$

$$\text{where erfc}(x) = \frac{2}{\sqrt{\pi}}\int_x^\infty \exp(-t^2)dt$$

may be a complementary error function. For some SNR values, where decoding may be executed, the decoder may compute a probability that an $n^{th}$ error is located outside of a given enumeration or error span of the ordered component code. The component codes may be ordered according to their absolute soft bit information (e.g., LLR) values, for example, from the smallest to greatest.

Figure 8:
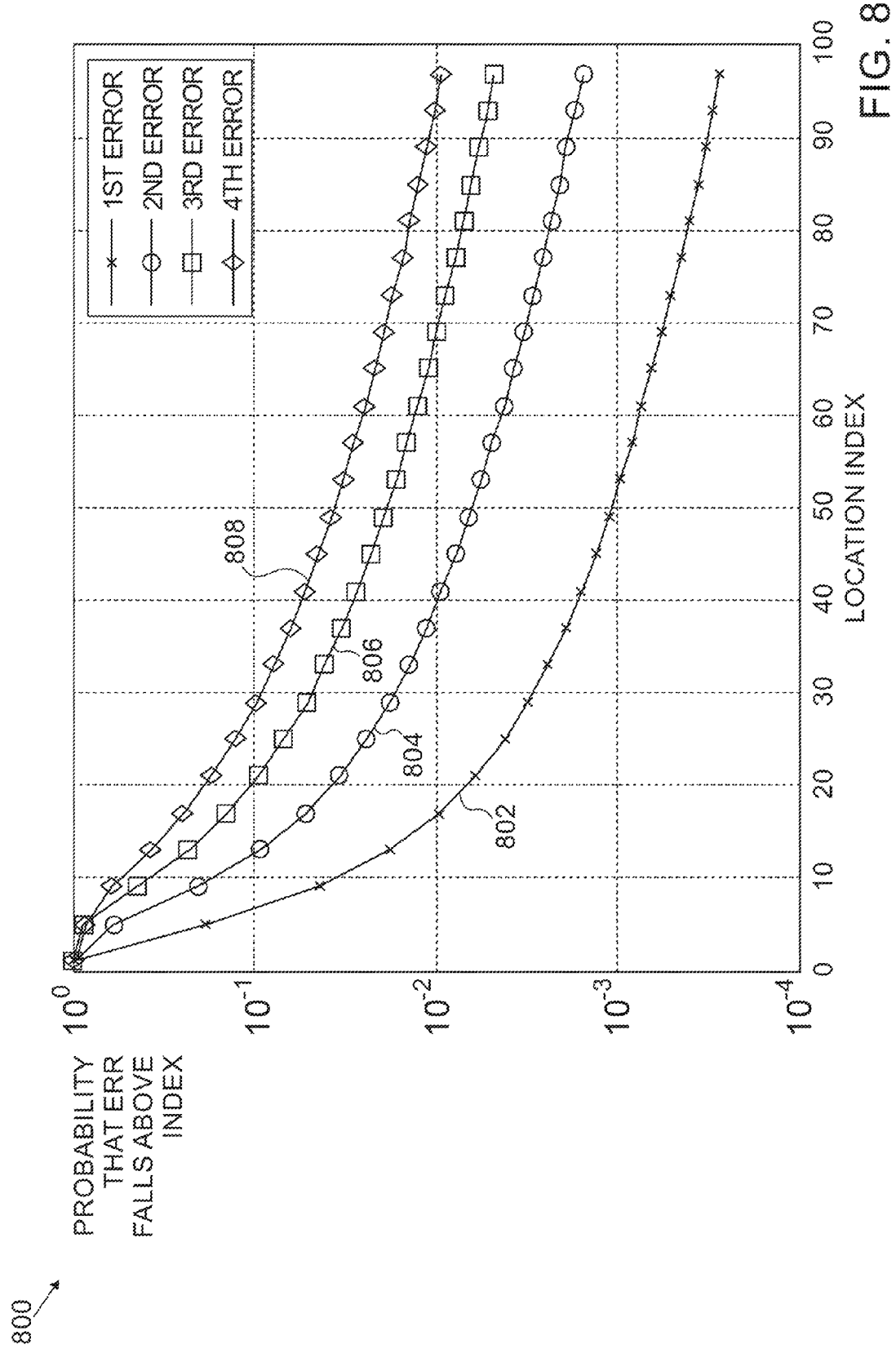
FIG. 8 is a graph of enumeration spans for soft decoding according to an embodiment of the invention.

Reference is made to FIG. 8, which is a graph 800 of enumeration spans for soft decoding according to an embodiment of the invention. FIG. 8 includes a plurality of curves 802-808 (e.g., four curves), where each may define a different error (e.g., $1^{st}$ error curve 802, $2^{nd}$ error curve 804, $3^{rd}$ error curve 806 and $4^{th}$ error curve 808). Each curve 802-808 in FIG. 8 may measure the probability (y-axis) that an $n^{th}$ error (the $n^{th}$ curve) is located outside of a given error span (from codeword location 0 to the x-value codeword location) of the ordered component code. FIG. 8 provides an example for a codeword of length 1 Kbits. In the example of FIG. 8, the probability that the $1^{st}$ error (e.g., in an LLR ordered code) is located outside the first 7 code locations is less than 0.1; the probability that the $2^{nd}$ error is located outside the first 12 locations is 0.1; the probability that the $3^{rd}$ error is located outside the first 20 locations is also 0.1; and the probability that the $4^{th}$ error is located outside the first 27 locations is also 0.1. More curves may be added to graph 800 for each bit for enumeration. Other numbers of bit enumerations may be used.

According to an embodiment of the invention, the enumeration span may be selected for each enumerated bit according to a threshold probability of containment within the span. The threshold probability may be associated with the component decoding success. In order to achieve iterative decoding success, the enumeration spans may be set according to the decoding threshold probability for success for each component. The span setting may also be associated with the decoding complexity. For example, the number of code correction evaluations may be approximately equal to the product of the enumeration spans. If the target probability of failure is set to be too low, then the enumeration spans may be relatively high, and the induced decoding complexity may be high. In some embodiments, the decoding complexity may be bounded. For example, in flash memory read operations, a time-out counter hardware resources for the decoding engines may limit the decoding complexity. Once the complexity limit is set, the minimal probability of failure may be determined per component. The decoder may check that the complexity of the enumeration span is within a complexity limit, for example, as shown in operation 950 of FIG. 9.

Figure 9:
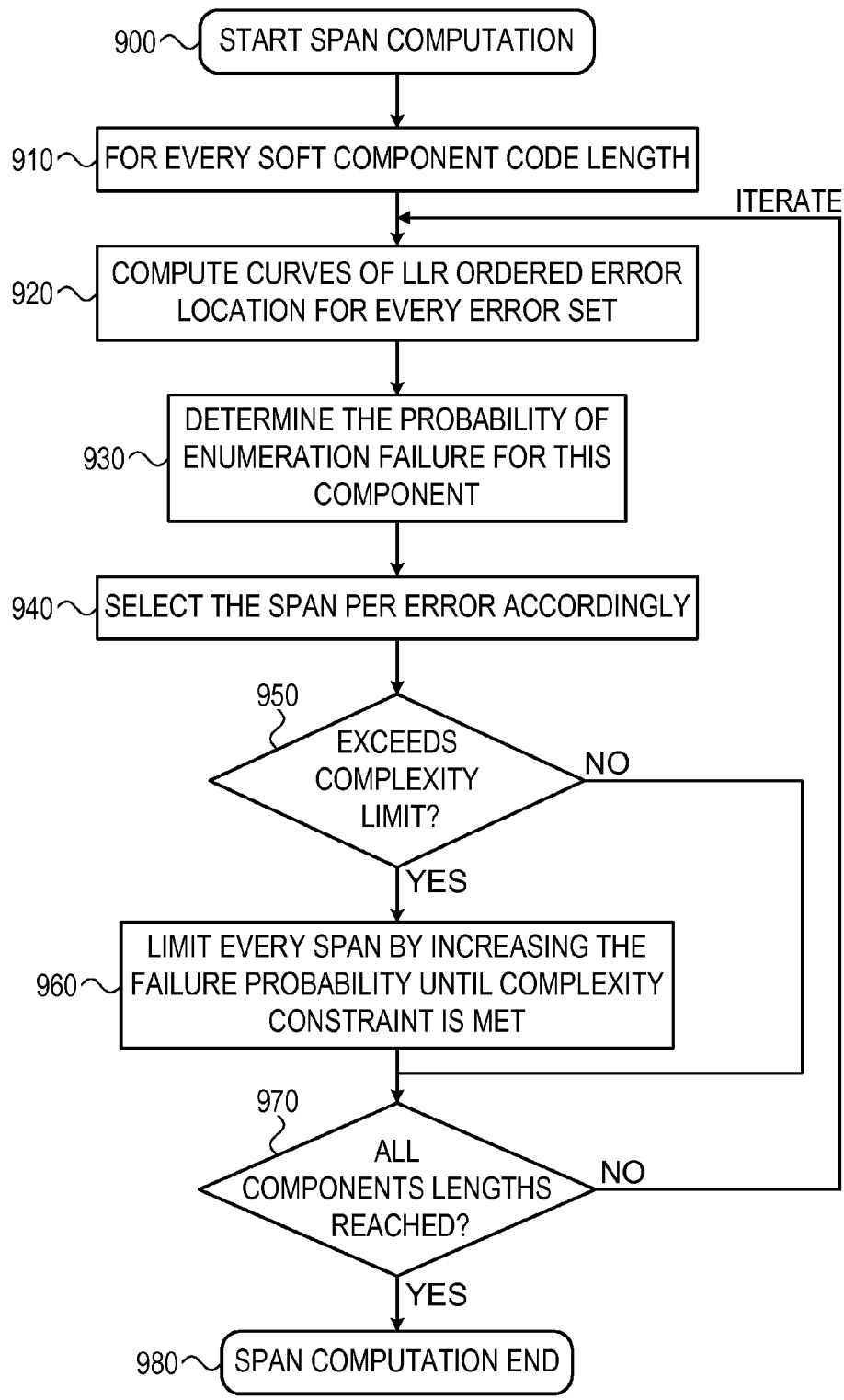
FIG. 9 is a flowchart of a method for computing the enumeration span for each component code according to an embodiment of the invention.

Reference is made to FIG. 9, which is a flowchart of a method for computing enumeration spans for each component code according to an embodiment of the invention.

In operation 900, a decoder (e.g., decoder 120 of FIG. 1) may initiate an enumeration span computation process.

In operation 910, for each length for the component code, the decoder may proceed to operation 920.

In operation 920, the decoder may compute curves of ordered error locations in the code for each error. The curves may measure the probability that the error for the curve is located outside a location of each length, for example, as shown in FIG. 8. The probability may be computed using soft bit information (e.g., LLR values) for the bits.

In operation 930, the decoder may determine the probability of enumeration failure for the component code.

In operation 940, the decoder may select the enumeration span for each error candidate for the component code, for example, using the probability of enumeration failure for the component.

In operation 950, the decoder may determine if the enumeration span for the error exceeds a complexity limit. If so, a process or decoder may proceed to operation 960. If not, a process or decoder may proceed to operation 970.

In operation 960, when the enumeration span exceeds the complexity limit, the decoder may limit each enumeration span, for example, by increasing the failure probability until the enumeration span no longer exceeds the complexity limit.

In operation 970, the decoder may determine if all component code lengths have been analyzed. If not, a process or decoder may return to operation 920 to analyze the next iterative component code length. If so, a process or decoder may proceed to operation 980.

In operation 980, the decoder may output enumeration spans for each component code and may end the process.

This process may be repeated or iterated for computing the enumeration span for each component code. Other operations or orders of operations may be used.

According an embodiment of the invention, the enumeration span may be updated during each iteration of the soft enumeration process. In order to achieve highly reliable decoding, the decoding complexity may be gradually increased in each iteration to obtain fast decoding for codewords with few errors. A set of error spans as function of iteration number may be defined, for example, as follows in table 3 (other error spans may be used).

TABLE 3

An example set of vectors of enumeration spans as function of iteration.

| Iteration Count | Enumeration Span Vector | | | |
|---|---|---|---|---|
| | Bit[0] | Bit[1] | Bit[2] | Bit[3] |
| 1 | 7 | 12 | 20 | 27 |
| 2 | 7 | 12 | 20 | 27 |
| 3 | 7 | 12 | 20 | 27 |
| 4 | 12 | 20 | 36 | 48 |
| 5 | 14 | 24 | 40 | 54 |

In the example shown in table 3, in the first iteration, the vector of enumeration spans is (7,12,20,27), indicating that errors bit [0], [1], [2], [3] have a sufficiently high probability of being located in an error span or width of the first $7^{th}$, $12^{th}$, $20^{th}$, and $27^{th}$ bits of a code. The iterations may proceed if the complexity limit is exceeded. In the second and third iterations, the same error span results are generated and the complexity limit is again exceeded. In the fourth iteration, a different enumeration span vector, (12,20,36,48), is generated, indicating that errors bit [0], [1], [2], [3] have a sufficiently high probability of being located in an error span or width of the first $12^{th}$, $20^{th}$, $36^{th}$, and $48^{th}$ bits of a code. The complexity limit is again exceeded and a fifth iteration is executed, generating enumeration span vector, (14,24,40,54), indicating that errors bit [0], [1], [2], [3] have a sufficiently high probability of being located in an error span or width of the first $14^{th}$, $24^{th}$, $40^{th}$, and $54^{th}$ bits of a code. In the fifth iteration, the complexity limit is not exceeded and the enumeration span vector, (14,24,40,54), is validated. According to an embodiment of the invention, the enumeration ordering may be performed in an increasing order of likelihood, for example, over all partial sums of absolute LLRs. In some embodiments, the complexity limit may depend on the number of candidates defined by the enumeration spans and total bits to be enumerated. FIG. 8 shows an example of a probability computation for the $1^{st}$, $2^{nd}$, $3^{rd}$ and $4^{th}$ errors within the enumeration span. The n-th error location probability may depend on a component code length and input bit-error probability.

Figure 10:
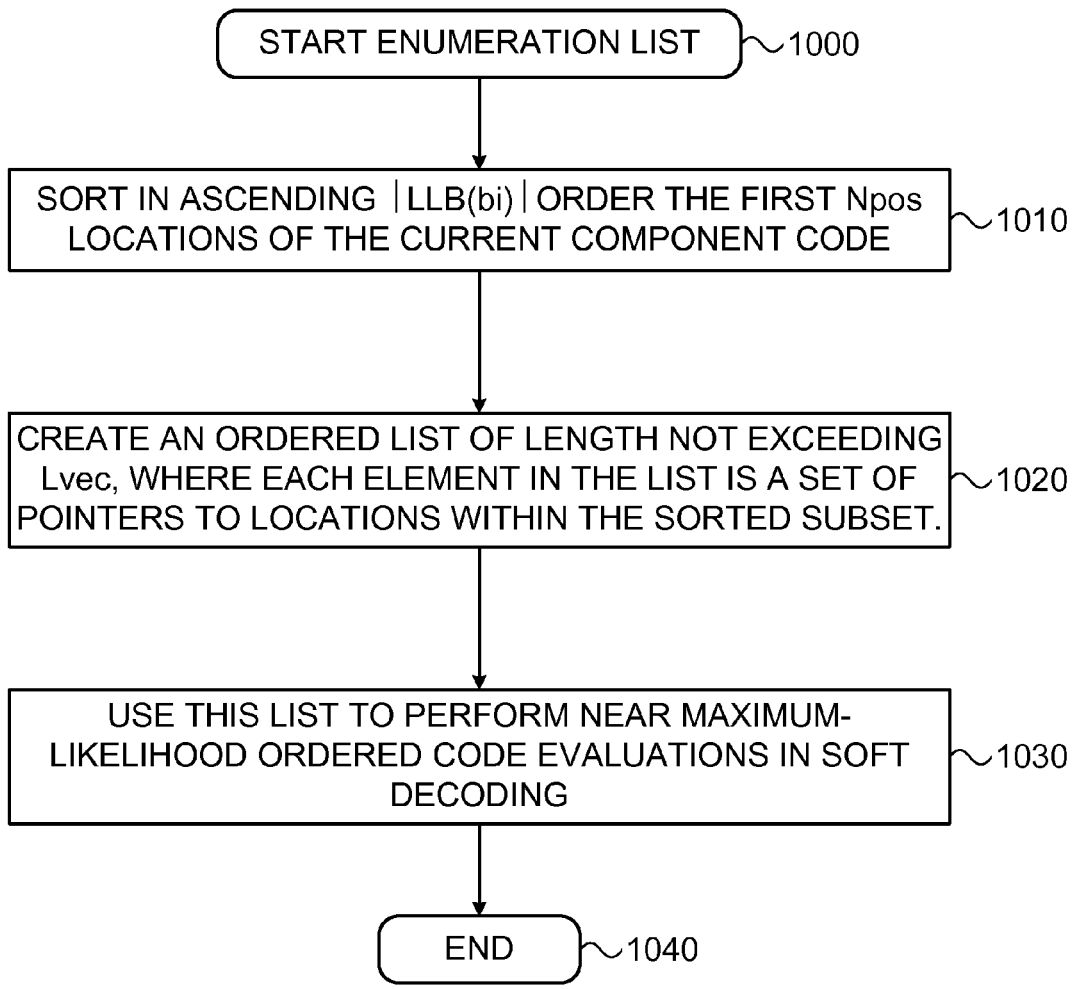
FIG. 10 is flowchart of a method for generating a list of candidate error corrections for each component code according to an embodiment of the invention.

Reference is made to FIG. 10, which is a flowchart of a method for generating a list of candidate error corrections for each component code according to an embodiment of the invention.

In operation 1000, a soft component decoder (e.g., decoder 120 of FIG. 1) may initiate a process for generating a list of hypotheses or candidate error corrections, for example, for correcting a component code.

In operation 1010, the decoder may sort soft bit information of candidate error corrections for a single component code according to their associated reliability metrics (soft bit information), for example, in an ascending order from the smallest reliability metric to the ($N_{pos}^{th}$) smallest metric. The decoder may discard or ignore the remaining subset of $N+1_{pos}^{th}$ or greater elements. The reliability metrics may be mapped onto a uniform or integer scale. Component code bits may be sorted, for example, according to the combined or sum of the absolute values of the LLR of the bits, $|LLR(b_i)|$ they encode.

In operation 1020, the decoder may create an ordered list of up to $L_{vec}$ elements, for example, where each element in the list may include a set of pointers to locations of the $N_{pos}$ elements within the sorted subset. The combined associated soft bit values (e.g., sum-LLRs) of the list elements may be arranged in a monotonically changing (e.g., non-decreasing) order. Thus, the list need not limit the number of bit-corrections that may be applied. The number of corrected bits per hypothesis in the $L_{vec}$ element list may be a direct result of the minimal partial sums of absolute LLR values of the first $N_{pos}$ smallest locations.

In operation 1030, the decoder may use the list to evaluate the candidate errors together with the component decoder and select a highest likelihood error candidate, for example, achieving a near maximal likelihood (ML) decoding performance.

In operation 1040, the soft component decoder may output a partial list of likely candidates or a single candidate with the highest likelihood and may end the process.

This process may be repeated or iterated to generate an enumeration list for each component code. Other operations or orders of operations may be used.

Figure 11:
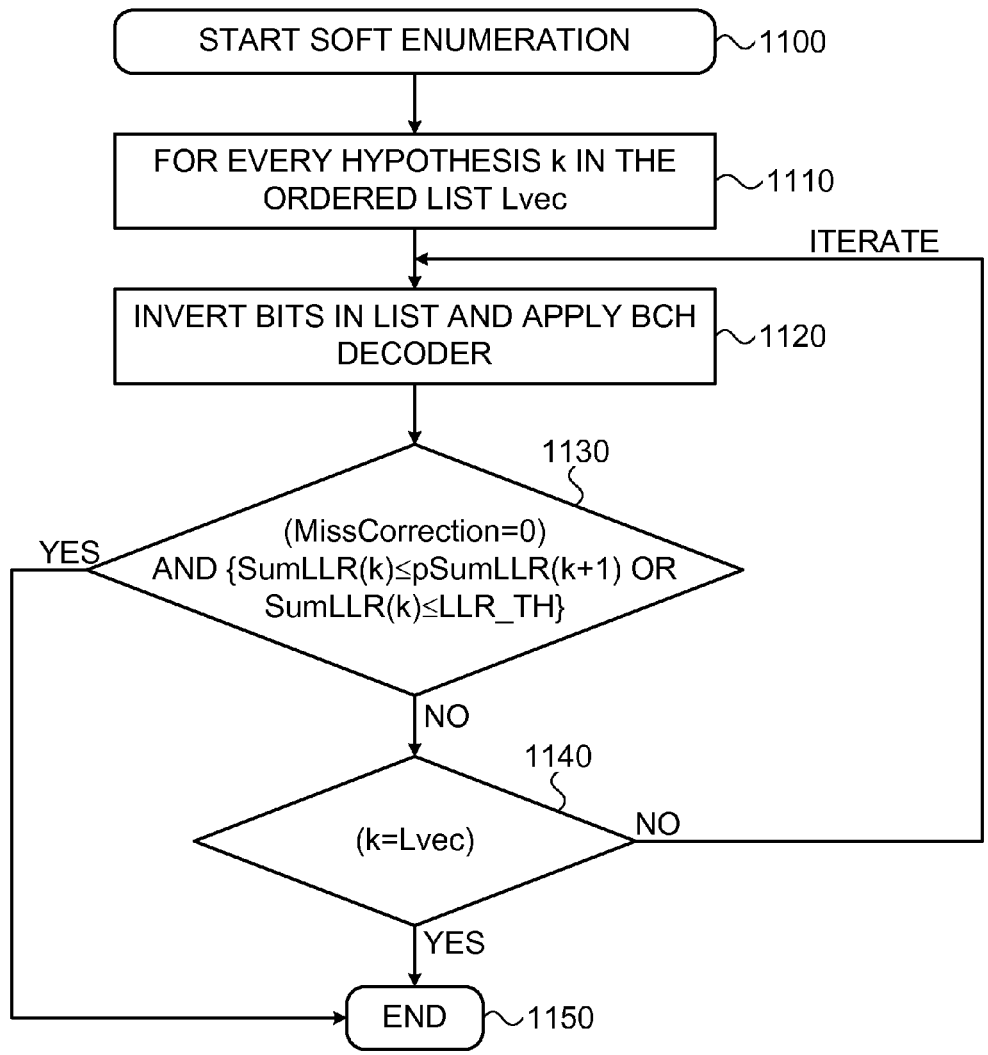
FIG. 11 is a flowchart of a method for an enumeration span computation process for each component code according to an embodiment of the invention.

Reference is made to FIG. 11, which is a flowchart of a method for enumerating over a list of hypothesis for each component code according to an embodiment of the invention.

In operation 1100, a soft component decoder (e.g., decoder 120 of FIG. 1) may initiate a soft enumeration process.

In operation 1110, the decoder may generate a list, e.g., Lvec, of candidate error corrections or hypotheses for correcting a component code. Each element in Lvec may be a vector defining the location of erroneous bits for each candidate error corrections. The list may be generated in the process of FIG. 10. Each ($k^{th}$) hypotheses in the list, Lvec, may be decoded over the enumeration span or codeword bit-length within which the error bits have a greater than threshold probability of being found.

In operation 1120, the decoder may invert (flip) bits in the codeword according to the ($k^{th}$) hypothesis and may apply a soft decoding mechanism to check the validity of the hypothesis.

In operation 1130, the decoder may determine if the enumeration may terminate before processing all hypotheses in the list. Early terminate may be executed, for example, if a current ($k^{th}$) hypothesis meets certain conditions. A first condition may be that the soft bit information (sumLLR) of the ($k^{th}$) hypothesis (e.g., evaluated after applying the code correction) has a score which is smaller than the soft bit score (sumLLR) of the next ($k+1^{th}$) hypothesis in the list (e.g., evaluated before applying the code correction). A second condition for early termination may be that the soft bit score (sumLLR) of the ($k^{th}$) hypothesis (e.g., evaluated after applying the code correction) is smaller than a predetermined threshold. For example, the decoder may terminate after processing the ($k^{th}$) hypothesis if the hypothesis has a negative measure of false positives (missCorrection=0) and the soft bit score (sumLLR) of the ($k^{th}$) hypothesis is less than or equal to a factor, p, of the soft bit score (sumLLR) of the nest sequential ($k+1^{th}$) hypothesis (SumLLR(k)≤pSumLLR(k+1)) or if the soft bit score (sumLLR) of the ($k^{th}$) hypothesis is less than or equal to a soft bit threshold for the code (SumLLR(k) ≤LLR_TH), where p is a constant≤1. If the condition is false, a process or decoder may continue enumeration and proceed to operation 1140, while if the condition is true, a process or decoder may terminate the process to select the ($k^{th}$) hypothesis without analyzing the soft bit information associated with the remaining candidate error corrections and proceed to operation 1150. Early termination for the soft component decoder may reduce the overall decoder complexity. Other or different conditions may be used.

In operation 1140, the decoder may attempt to increment the ($k^{th}$) hypothesis index (e.g., incremented to the k+1 hypothesis in the list Lvec) to evaluate the next hypothesis. If the (k+1) hypothesis exists, the decoder may return to operation 1120 with the reset (k+1) hypothesis index. However, if the (k+1) hypothesis index does not exists, the list of hypotheses (1, . . . , k) has been completed and the process or decoder may proceed to operation 1150.

In operation 1150, the decoder may generate a sub-list of the list input in operation 1110, for example, including one or more optimal candidates (e.g., with below threshold sumLLR values). The sub-list of optimal candidates may be input into a decoder and further reduced to generate a single accepted candidate for correcting the input bits.

This process may be repeated or iterated for decoding each component code. Other operations or orders of operations may be used.

Instead of simply outputting a single most likely output hypothesis, a soft decoder operating according to embodiments of the invention may output an ordered list of most likely candidate error corrections for each component. The list may be a sub-list of candidates having optimal soft decoding values (e.g., the smallest sum-LLR values) and may exclude the remaining candidates or potential error corrections with sub-optimal soft decoding values (e.g., the largest sum-LLR values). The decoder may decode the sub-list (e.g., prior to or instead of decoding the remaining candidates) of only the most likely candidates to increase decoding efficiency. The size of the sub-list or number of sub-list candidates may be limited to reduce the decoding complexity.

Figure 12:
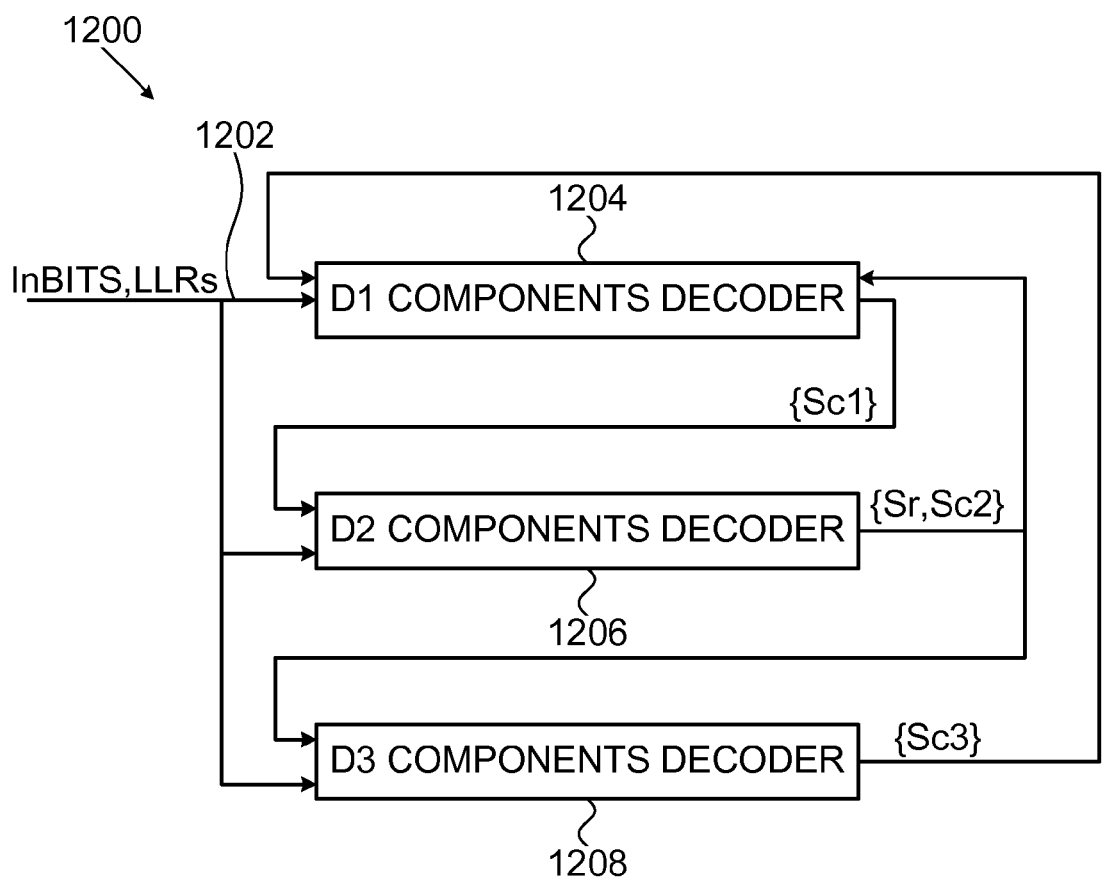
FIG. 12 is a schematic illustration of a multi-dimensional decoder for soft decoding according to an embodiment of the invention.

The complexity of iterative decoding multiple candidate error corrections may grow exponentially fast with the number of iterations and candidates. Accordingly, decoding may be compartmentalized by decoding in multiple different stages (dimensions) with decreased complexity (number of flipped bits) in each dimension. A multi-dimensional component decoder (e.g., as shown in FIG. 12) may iteratively correct and refine different versions of the same sets of data in each sequential dimension. Although fewer corrections may be made in each dimension or decoding stage (to decrease complexity), together, the multiple dimensions may correct an increased number (e.g., a limitless number) of bits.

In a first dimension, a soft decoder may generate a plurality of candidate error corrections for each component code, which includes hard bit values and soft bit information. Each candidate may suggest corrections for the corresponding component code, for example, inverting up to a maximum number of hard bit value changes (limited by the decoder complexity). The soft decoder may evaluate the plurality of candidates to select the optimal candidate for the first dimension and may apply that candidate to correct the component code.

Candidates may be selected based on their soft bit information, for example, defining a probability that the component code is valid when the suggested change of the candidate is applied. In some embodiments, a candidate may be selected that has a greatest probability, a probability within a predetermined threshold value range, optimal soft bit information (e.g., within a predetermined threshold value range), a difference between or ratio of optimal soft bit information of the selected candidate error correction and a closest soft bit information to the optimal soft bit information of another candidate error correction in the plurality of candidate error corrections that is within a predetermined threshold value range, or other soft bit information criteria.

In some embodiments, each candidate in the list may be assigned a score, for example, according to these criteria and the candidate may be selected with an optimal score. In one embodiment, the score may measure the probability for valid corrections (e.g., the sum-LLR values) less a number of contradictory candidate error corrections in other dimension(s). In one example, the score may be decremented (or incremented) for each contradictory candidate error correction generated in another dimension. Candidates may be removed from the list based on their scores. The list may be iteratively reduced decreasing the number of candidate error corrections until a single candidate error correction remains. The decoder may select the single remaining candidate error correction to decode and update the first component code. The updated component code corrected in the first dimension may be input to a soft decoder in the next sequential (second) dimension.

In the next sequential iteration in a next sequential dimension, a soft decoder inputs the corrected output of the previous (first) dimension (e.g., with reduced or partially corrected errors). The next sequential dimension may repeat the operations of decoding the component code, generating a list of candidates and selecting candidates to, again correct the encoded data. This iterative process may repeat for a predetermined number of iterations (dimensions) or may stop when the error probability of each codeword is less than a predetermined number of errors (e.g., zero) or less than a predetermined probability of error (e.g., $10^{-15}$).

Reference is made to FIG. 12, which schematically illustrates a multi-dimensional decoder 1200 for soft decoding according to an embodiment of the invention.

Decoder 1200 (e.g., decoder 120 of FIG. 1) may include a plurality of (N) decoder engines 1204, 1206, 1208 (e.g., N=3 for 3D code; other N may be used).

In the example shown, a first decoder engine 1204 may be a soft decoder for decoding component codes in a first dimension (D1) of code (e.g., first dimensional data stream 204 of FIG. 2). First decoder engine 1204 may input a data stream 1202 (e.g., input stream 202 of FIG. 1) defining hard bit information (e.g., bit values) and soft bit information (e.g., probabilities of the bit values, such as LLR values). First decoder engine 1204 may output a list of a plurality of candidate error corrections for correcting a component code in the first dimension (D1). Each candidate in the list may be scored to generate a scored list {Sc1}.

A second decoder engine 1206 may be a soft decoder for decoding component codes in a second dimension (D2) of code (e.g., second dimensional data stream 206 of FIG. 2). While engines or processes herein are described as ordered as first, second, etc., and within specific embodiments the ordering may be significant, in other embodiments the ordering may differ. Second decoder engine 1206 may input the (scored) list of candidate error corrections ({Sc1}) from first decoder engine 1204 and data stream 1202. When decoding components in the second dimension (D2) of data stream 1202, second decoder engine 1206 may output a refined (scored) candidate list {Sr}, with scores from the first dimension list {Sc1} decremented (or incremented) by a value for each contradictory candidate in the second dimensional list {Sc2}. If the refined candidate list {Sr} has a single candidate, that candidate may be selected and used to correct the component code in the first dimension. Otherwise a third decoder engine 1208 in a third decoding dimension may be used.

A third decoder engine 1208 may be a soft decoder for decoding component codes in a third dimension (D3) of code (e.g., third dimensional data stream 208 of FIG. 2). Third decoder engine 1206 may input the (scored) list of candidate error corrections ({Sc2}) from second decoder engines 1206 and data stream 1202. When decoding components in the third dimension (D3) of data stream 1202, third decoder engine 1208 may output a refined (scored) candidate list {Sr}, with scores from the second dimension list {Sc2} decremented for each contradictory candidate in the second dimensional list {Sc3}. If the refined candidate list {Sr} has a single candidate, that candidate may be selected and used to correct the component code in the second dimension. Otherwise additional (e.g., up to N) decoder engines may be used.

Figure 13A:
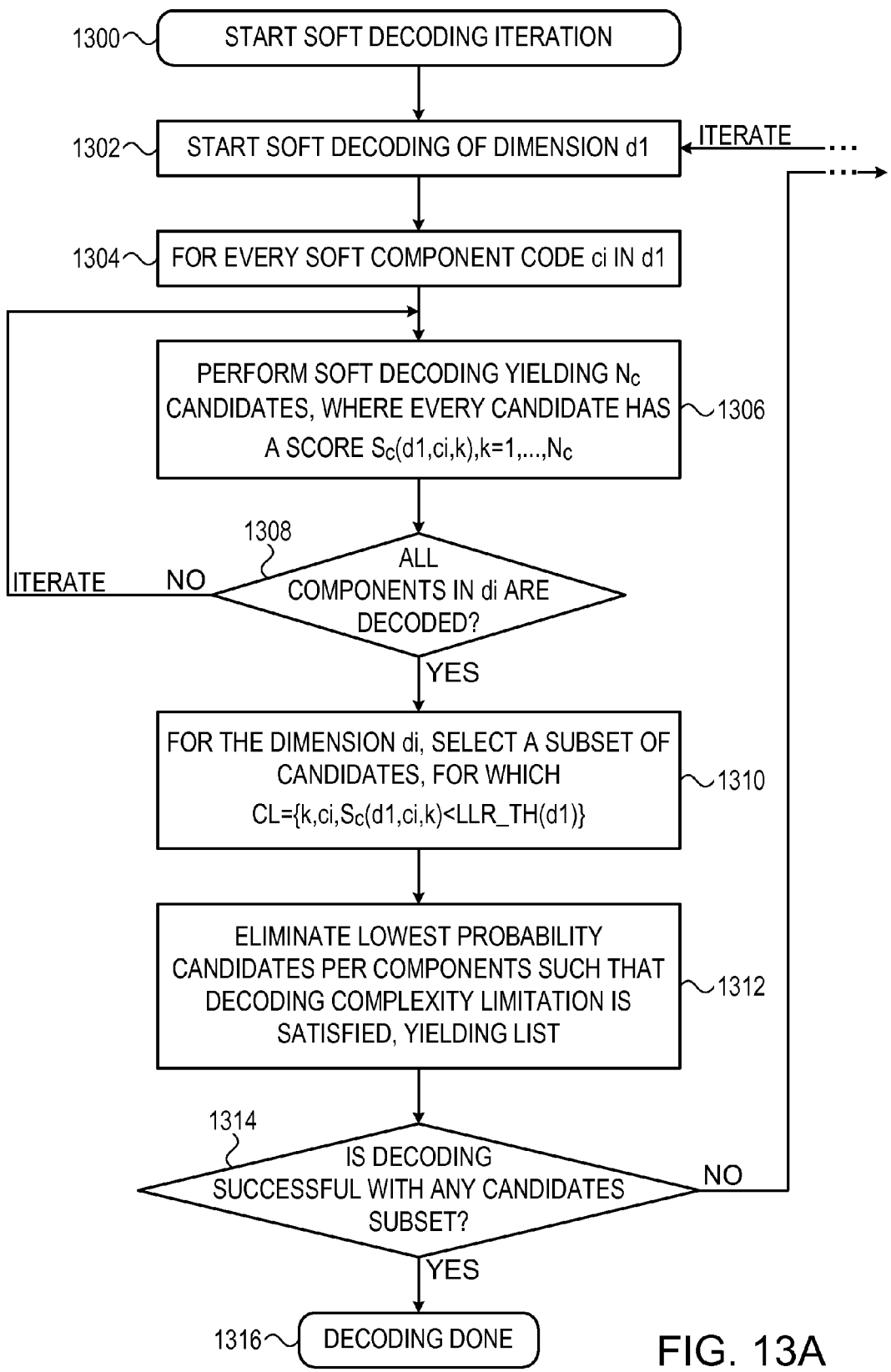
FIGS. 13A and 13B are flowcharts of a method for soft decoding multi-dimensional encoded data according to an embodiment of the invention.
Figure 13B:
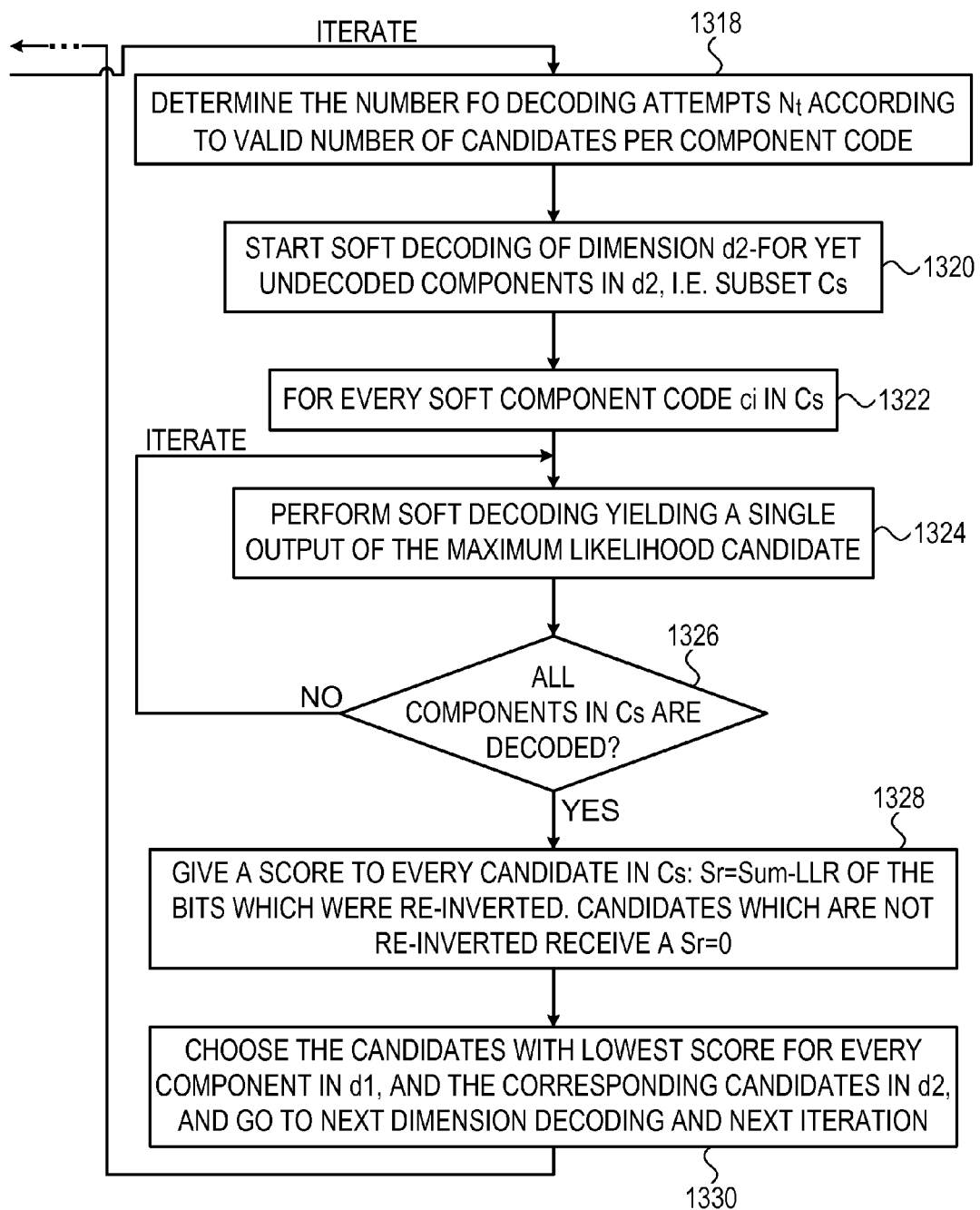

Reference is made to FIGS. 13A and 13B, which are flowcharts of a method for soft decoding multi-dimensional encoded data according to an embodiment of the invention.

In operation 1300, a decoder (e.g., decoder 120 of FIG. 1) may initiate a soft decoding iteration. A single iteration may generate a list of candidates for a component code in one dimension.

In operation 1302, the decoder (e.g., first decoder engine 1204 of FIG. 12) may start soft decoding component codes in a first dimension (D1) of multi-dimensional code.

In operation 1304, for every component code, ci, in first dimension (D1), a process or decoder may proceed to operation 1306.

In operation 1306, the decoder may perform soft decoding to generate a plurality of (Nc) candidate error corrections for the component code, ci. The plurality of (Nc) candidates may be all possible error corrections for the component, ci. In some embodiments, scores $Sc(d1,ci,k)$, $k=1, \ldots, Nc$, may be generated for each candidate (k) for the component code (ci) in dimension (D1). In one example, the score $Sc(d1,ci,k)$ may be:

$$S_c(D1, ci, k) = \sum_{b_m \in C} |LLR(b_m)|$$

where C may be the set of predicted bit locations of errors in the component code, ci. The set of (Nc) candidates may be a sub-set of all possible corrections having the relatively smallest scores, $Sc(d1,ci,k)$, $k=1, \ldots, Nc$, generated during the enumeration of the soft decoder for the component code, ci.

In operation 1308, the decoder may determine if all components, ci, in the first dimension (D1) are decoded. In not, a process or decoder may return or iterate to operation 1306 using the next un-decoded component code, ci+1. However, if all components in (D1) are decoded, a process or decoder may proceed to operation 1310.

In operation 1310, for the first dimension (D1), the decoder may select a sub-set of candidates from the plurality of (Nc) candidates for the component, ci, for example, with the most optimal scores. In the example above, the sub-set of candidate may have the smallest score $Sc(d1,ci,k)$, $k=1, \ldots, Nc$. A sub-set of candidates list may be selected in order to provide the highest probability candidates, such that the scores of the remaining candidates are within an optimal threshold range (e.g., $\{k,ci, Sc(d1,ci,k)<LLR\_TH(d1)\}$).

In operation 1312, if the list of candidates is too long for example exceeding a complexity limitation, the decoder may further reduce the list of candidates until the list complexity is less than or equal to the complexity limitation.

In operation 1314, the decoder may determine if the decoding is successful with any candidate in the subset. If so, a process or decoder may decode with such a candidate and proceed to early termination in operation 1316. Otherwise, a process or decoder may proceed to operation 1318.

In operation 1318, the decoder may determine a number of decoding attempts Ni according to the valid number of candidates per component code.

In operation 1320, the decoder (e.g., second decoder engine 1206 of FIG. 12) may start soft decoding a sub-set of un-decoded component codes, Cs, in a second dimension (D2) of multi-dimensional code. The sub-set of component codes in the second dimension may be decoded to validate or contradict each of an optimal subset of candidates initially generated in the first dimension. In one embodiment, only the candidates with the smallest scores or greatest probabilities may be re-evaluated in the second dimension, for example, for a total of Nt re-evaluations.

In operation 1322, for each component code ci in Cs, a process or decoder may proceed to operation 1324.

In operation 1324, the decoder may perform soft decoding to output a single maximum likelihood candidate, for example, having the smallest score.

In operation 1326, the decoder may determine if all components Cs in the second dimension (D2) are decoded. In not, a process or decoder may return or iterate to operation 1324 using the next un-decoded component code in Cs. However, if all components in Cs are decoded, a process or decoder may proceed to operation 1328.

In operation 1328, the decoder may assign a score to each candidate in the candidate list generated in the first dimension indicating the (number or degree) of contradictory candidates in the second dimension. Each contradictory candidate in the second dimension may re-invert bits to be inverted by a candidate in the first dimension. In one example, for every candidate, a score Sr may be assigned, as follows:

$$S_r = \sum_{b_m \in R_c} |LLR(b_m)|$$

where Rc may be the set of bit locations which are the intersection of C and the corrected bits generated in the second dimension. That is, the set Rc may include bits which were corrected by a candidate of the first dimension and were corrected again (re-inverted) by component decoders in the second dimension. In one example, if there are no re-inverted bits in the second dimension, the set Rc may be an empty set and Sr=0 for such candidates.

In operation 1330, the decoder may select the candidates from Sc with the optimal (e.g., smallest) scores (e.g., Sc and Sr). A process or decoder may proceed to operation 1302 to execute a subsequent iteration in the next sequential dimension. If no such sequential dimension exists, a process or decoder may proceed to operation 1316 to end the soft decoding process.

Other operations or orders of operations may be used.

According to an embodiment of the invention, the list decoder may not be used in each iteration. It may be appreciated that the candidate list size Nc may be limited to 1 for some iterations, in order to reduce decoding complexity in some decoding iterations. In other embodiments, the candidate list size Nc may be gradually increased, for example from Nc=1 to Nc=4 as function of the iteration counter, as shown in the example in following table 4 (other numbers may be used, and other numbers of iterations may be used).

TABLE 4

An example of the list size and decoding complexity limitation, as function of iteration count.

| Iteration Count (i) | List size (Nc) | Complexity Limit (Nt) |
|---|---|---|
| 1 | 1 | 1 |
| 2 | 1 | 1 |
| 3 | 2 | 10 |
| 4 | 3 | 20 |
| 5 | 4 | 40 |
| ... | ... | ... |

Figure 14:
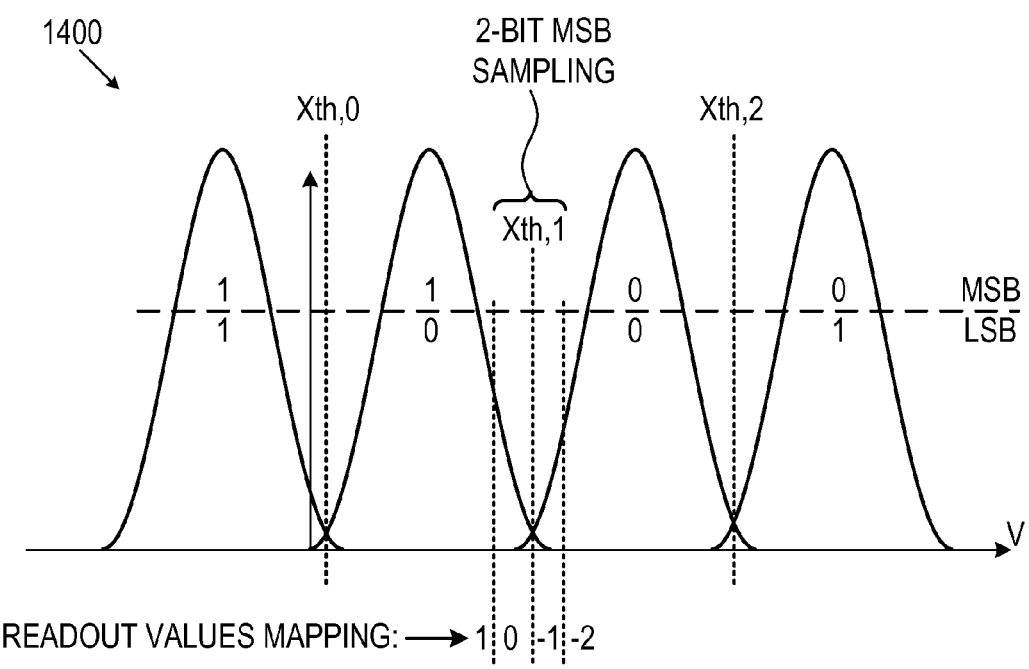
FIG. 14 a graph of a threshold voltage distribution according to an embodiment of the invention.

Reference is made to FIG. 14, which is a graph of a threshold voltage distribution 1400 used to generate soft bit information according to an embodiment of the invention. Threshold voltage distribution 1400 may be a probability density function of a cell voltage level, according to which the value of a read threshold may be determine, for example, as 0 or 1. In the example of FIG. 14, a 2-bit per cell (bpc) flash memory device is used, although other memory devices may also be used.

Threshold voltage distribution 1400 may change over time, for example, due to multiple program/erase (P/E) operations of the memory. A common cause of change in threshold voltage distribution 1400, for example, in floating gate NAND flash technology, is known as "detrapping," in which charge may leak from the floating gate. Detrapping may increase threshold variance with the P/E cycles. As the number of cycles increases, the number of traps may also increase.

In one example, a read operation for 2 bpc memory page may include reading a most-significant bit (MSB) page and/or a least-significant bit (LSB). The MSB page may use a single threshold voltage for sampling (e.g., if there are sufficiently few errors). The threshold in this example for reading the MSB page bits is denoted by Xth,1. To read the LSB page bits, two read thresholds may be used (e.g., if there are sufficiently few errors), which are denoted here by Xth,0, and Xth,2.

Since the statistical distribution of threshold voltage distribution 1400 of a flash device may change over time, a read operation may require a decoder (e.g., decoder 120 of FIG. 1) to use multiple read thresholds for reliable decoding. If there is a relatively small number of errors, the decoder may input hard bit information for hard decoding once the threshold distribution statistics are known. In some embodiments, read threshold may be set such that a minimal number of read errors may be input into the decoder, for example, for successful hard decoding.

However, if is a relatively large number of errors, generating a single hard decision input may be insufficient for successful decoding. In such cases, a soft decoder may be used and soft bit information provided, for example, reliability information, for each bit may be input into the soft decoder by performing multiple read operations around the optimal threshold. This soft bit information may be generated by performing multiple read operations using different read thresholds. In the example of FIG. 14, the soft decoder may read the MSB page bits with soft input by sampling voltage values multiple times around threshold voltage Xth,1 to provide associated reliability metrics. In the example of FIG. 14, the soft decoder may read three times with three different thresholds for 2-bit accuracy soft information, for example, such that the readout values in the different ranges may be one of $\{-2, -1, 0, 1\}$, according to cell voltage. The readout values $\{-2, -1, 0, 1\}$ may be mapped to probability values or log-likelihood ratios (LLRs). Likewise, the soft decoder may read the LSB page bits with soft input by sampling voltage values multiple times around threshold voltages Xth,0, and Xth,2 to provide associated reliability metrics.

According to an embodiment of the invention a multi-dimensional hard decoder may be provided for hard decoding multi-dimensional codes. The multi-dimensional hard decoder may identify intersection bits and decode over the intersection bits, for example, to yield a lower frame error rate at a relatively low complexity as compared to conventional decoders. For multi-dimensional codes, when component codes are based on BCH codes, intersection decoding may correct a greater number of error than the typical BCH limit of $t=(D-1)/2$ errors for a single component code. The multi-dimensional hard decoder may use side information of the multi-dimensional decoding failures to obtain low complexity decoding beyond the BCH bound.

According to an embodiment of the invention, a multi-dimensional soft decoder may be provided for soft decoding multi-dimensional codes. The multi-dimensional soft decoding may efficiently decode with low complexity, for example, by performing soft bit information (e.g., LLR) "clipping" or scaling during an iterative decoding for fast soft decoding. In addition, the multi-dimensional soft decoder may decode in extra dimensions to effectively operate on shorter codes, thus imposing a smaller span window. The multi-dimensional soft decoder may change a sum-LLR threshold as function of component and iteration count, for example, to yield low probability of false corrections and reliable decoding. The multi-dimensional soft decoder may order hypotheses or candidate corrections for enumeration of component code, for example, to enable a reduced set of hypotheses for evaluation, and provides an efficient sphere decoder which approximates maximum-likelihood performance. A sphere decoder may search for likely candidates within a limited range, e.g., a sphere of values around an initial estimation. In contrast, a conventional maximum-likelihood decoder may search all candidates, which may have a prohibitive complexity. The multi-dimensional soft decoding may analyze the enumeration complexity for each code component as function of the iteration count, for example, to enable fast decoding in the first few iterations. The multi-dimensional soft decoding may execute higher complexity decoding in further iterations, for example, to achieve reliable decoding at higher probability and fast decoding when there are few errors. The multi-dimensional soft decoding may decode lists of candidate error corrections for each component code, for example, to provide higher reliability decoding and enable correction of more errors. The multi-dimensional soft decoding may use sum-LLRs soft bit information to decide whether or not to clip the soft bit information at the output of the component soft decoder, which may increase the reliability of the soft bit information clipping. The multi-dimensional soft decoding may execute an early termination of a soft enumeration process, for example, using input threshold, which may allow fast soft decoding for each code component.

Although some embodiments describe a hard decoder that exactly defines the value of data bits and other embodiments describe a soft decoder that defines data bits values with uncertainty, embodiments for these different decoders may be combined or have aspects interchanged. In some embodiments, mechanisms used for hard decoding may be used for or combined with mechanisms for soft decoding by encoding and decoding the certainty measures together with the data bit values. Similarly, mechanisms used for soft decoding may be used for or combined with mechanisms for hard decoding by using a threshold detector to determine definite or exact bit values from uncertain soft bits.

It may be appreciated that different dimensions of multi-dimensional data may refer to different encoded versions of the same or overlapping data. These different versions may use different component codes, different orders or groupings of data bits. Each sequential dimension of encoded data may correspond to encoding data in a sequentially higher dimension of a multi-dimensional source data array or a 3D shape such as geometric prisms, such as, a cube. For example, each bit of encoded information (e.g., each parity bit) in a first dimension of encoded data may be generated by encoding a single dimension of the source data (e.g., a single row in a data array), while each bit of encoded information in a second dimension of encoded data may be generated by encoding data in two dimensions of the source data array, and so on, until each bit of encoded information in an Nth-dimensional data may be generated by encoding data in (N) dimensions of the source data array. In other embodiments, the dimension of the encoded data does not relate to the dimension of the source data encoded thereby, but is simply another encoding of the same or overlapping data. For example, one dimension of encoded data may be encoded by a first set of (e.g., BCH) component codes, while another dimension of encoded data may be encoded a different set or type of component code, such as, Reed-Solomon (RS) component codes, Hamming code component codes, convolutional component codes, etc. In yet other embodiments, each dimension may refer to a number of times code has been cycled through a decoder. For example, each sequential decoding dimension may re-cycle the output of a previous encoding dimension.

It may be appreciated that when used herein, "correcting" or "updating" data, such as data bits, codewords or component codes, may refer to changing values of the data and not necessarily to generating the correct or accurate change. For example, a correction or update may be valid (a successful correction) or invalid (a false correction).

It may be appreciated that when used herein, soft bit information or values may refer to the soft (reliability/probability) information or values associated with one or more bits, for example, the combined bits in a component codeword.

Embodiments of the invention may be software-implemented using dedicated instruction(s) (e.g., stored in a memory 102,118 of FIG. 1) or, alternatively, hardware-implemented using a designated encoders (e.g., encoder 100-116 of FIG. 1), decoders (e.g., one or more decoder 120 of FIG. 1) and/or logic arrays.

Embodiments of the invention may include an article such as a computer or processor readable medium, or a computer or processor storage medium, such as for example a memory, a disk drive, or a USB flash memory, for encoding, including or storing instructions which when executed by a processor or controller (for example, processor 104 of FIG. 1), carry out methods disclosed herein.

Although the particular embodiments shown and described above will prove to be useful for the many distribution systems to which the present invention pertains, further modifications of the present invention will occur to persons skilled in the art. All such modifications are deemed to be within the scope and spirit of the present invention as defined by the appended claims.

The invention claimed is:
1. A method for decoding data, the method comprising:
receiving multi-dimensional encoded data potentially having errors, wherein the multi-dimensional encoded data comprises encoded bits generated by encoding each input bit in a set of input bits multiple times in multiple different dimensions;

performing a first dimension decoding of all the encoded bits, wherein the performing of the first dimension decoding comprises marking locations of one or more errors found during the first dimension decoding, if detecting the one or more errors during the first dimension decoding, without making suggested corrections to one or more potentially erroneous encoded bits associated with the one or more errors found during the first dimension decoding;

performing a second dimension decoding of each second dimension code component that comprises at least one of the one or more potentially erroneous encoded bits associated with the one or more errors found during the first dimension decoding, while not encoding second dimension code components that do not include any one of the one or more potentially erroneous encoded bits associated with the one or more errors found during the first dimension decoding;

wherein the performing of the second dimension decoding comprises marking locations of one or more errors found during the second dimension decoding, if detecting the one or more errors during the second dimension decoding, without making suggested corrections to one or more potentially erroneous encoded bits associated with the one or more errors found during the second dimension decoding;

performing a third dimension decoding of each third dimension code component that comprises at least one of the one or more potentially erroneous encoded bits associated with the one or more errors found during the first dimension decoding, while not encoding third dimension code components that do not include any one of the one or more potentially erroneous encoded bits associated with the one or more errors found during the first dimension decoding;

wherein the performing of the third dimension decoding comprises marking locations of one or more errors found during the third dimension decoding, if detecting the one or more errors during the third dimension decoding, without making suggested corrections to one or more potentially erroneous encoded bits associated with the one or more errors found during the third dimension decoding; and determining whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; and (c) the suggested corrections to the one or more potentially erroneous encoded bits associated with the one or more errors found during the third dimension decoding.

2. The method of claim 1, comprising changing a value of an encoded bit if the encoded bit is associated with at least two errors found during at least two dimensions of the first, second and third dimensions.

3. The method of claim 1 wherein a performing of a certain dimension encoding out of the first, second and third dimensions comprises detecting an error in an encoded bit by comparing between outcomes that the certain dimension decoding of different hypotheses that differ from each other by a value of the encoded bit.

4. The method according to claim 1 wherein at least one of the first, second and third dimension decoding includes soft decoding.

5. The method according to claim 1 wherein the multi-dimensional encoded data is arranged in an array that has rows and columns and comprises multiple folded codewords, wherein each folded codeword spans along more than a single row or column of the array; wherein the first and third dimension decoding are applied on single rows of the array; and wherein the second dimension decoding is applied on single rows of the array.

6. The method according to claim 1 further comprising:
performing a fourth dimension decoding of each fourth dimension code component that comprises at least one of the one or more potentially erroneous encoded bits associated with the one or more errors found during the first dimension decoding, while not encoding fourth dimension code components that do not include any one of the one or more potentially erroneous encoded bits associated with the one or more errors found during the first dimension decoding;

wherein the performing of the fourth dimension decoding comprises marking locations of one or more errors found during the fourth dimension decoding, if detecting the one or more errors during the fourth dimension decoding, without making suggested corrections to one or more potentially erroneous encoded bits associated with the one or more errors found during the fourth dimension decoding;

performing a fifth dimension decoding of each fifth dimension code component that comprises at least one of the one or more potentially erroneous encoded bits associated with the one or more errors found during the first dimension decoding, while not encoding fifth dimension code components that do not include any one of the one or more potentially erroneous encoded bits associated with the one or more errors found during the first dimension decoding;

wherein the performing of the fifth dimension decoding comprises marking locations of one or more errors found during the fifth dimension decoding, if detecting the one or more errors during the fifth dimension decoding, without making suggested corrections to one or more potentially erroneous encoded bits associated with the one or more errors found during the fifth dimension decoding;

determining whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; (c) the suggested corrections to the one or more potentially erroneous encoded bits associated with the one or more errors found during the third dimension decoding; (d) the suggested corrections to the one or more potentially erroneous encoded bits associated with the one or more errors found during the fourth dimension decoding; and (e) the suggested corrections to the one or more potentially erroneous encoded bits associated with the one or more errors found during the fifth dimension decoding.

7. The method of claim 6, comprising changing a value of an encoded bit if the encoded bit is associated with at least three errors found during at least three dimensions of the first, second, third, fourth and fifth dimensions.

8. The method according to claim 6 wherein the multi-dimensional encoded data is arranged in an array that has rows and columns and comprises multiple folded codewords, wherein each folded codeword spans along more than a single row or column of the array; wherein the first, third and fifth dimension decoding are applied on single rows of the array; and wherein the second and fourth dimension decoding are applied on single rows of the array.

9. A system for decoding data, the system comprising a processor and a decoder;
  wherein the processor is arranged to receive multi-dimensional encoded data potentially having errors, wherein the multi-dimensional encoded data comprises encoded bits generated by encoding each input bit in a set of input bits multiple times in multiple different dimensions; and
  wherein the decoder is arranged to:
    perform a first dimension decoding of all the encoded bits, wherein the a performing of the first dimension decoding comprises marking locations of one or more errors found during the first dimension decoding, if detecting the one or more errors during the first dimension decoding, without making suggested corrections to one or more potentially erroneous encoded bits associated with the one or more errors found during the first dimension decoding;
    perform a second dimension decoding of each second dimension code component that comprises at least one of the one or more potentially erroneous encoded bits associated with the one or more errors found during the first dimension decoding, while not encoding second dimension code components that do not include any one of the one or more potentially erroneous encoded bits associated with the one or more errors found during the first dimension decoding;
    wherein a performing of the second dimension decoding comprises marking locations of one or more errors found during the second dimension decoding, if detecting the one or more errors during the second dimension decoding, without making suggested corrections to one or more potentially erroneous encoded bits associated with the one or more errors found during the second dimension decoding;
    perform a third dimension decoding of each third dimension code component that comprises at least one of the one or more potentially erroneous encoded bits associated with the one or more errors found during the first dimension decoding, while not encoding third dimension code components that do not include any one of the one or more potentially erroneous encoded bits associated with the one or more errors found during the first dimension decoding;
    wherein a performing of the third dimension decoding comprises marking locations of one or more errors found during the third dimension decoding, if detecting the one or more errors during the third dimension decoding, without making suggested corrections to one or more potentially erroneous encoded bits associated with the one or more errors found during the third dimension decoding; and
    determine whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; and (c) the suggested corrections to the one or more potentially erroneous encoded bits associated with the one or more errors found during the third dimension decoding.

10. The system of claim 9, wherein the decoder is arranged to change a value of an encoded bit if the encoded bit is associated with at least two errors found during at least two dimensions of the first, second and third dimensions.

11. The system of claim 9 wherein the decoder is arranged to perform a certain dimension encoding out of the first, second and third dimensions by detecting an error in an encoded bit by comparing between outcomes the certain dimension decoding of different hypotheses that differ from each other by a value of the encoded bit.

12. The system according to claim 9 wherein the decoder is arranged to perform soft decoding during at least one of the first, second and third dimension decoding.

13. The system according to claim 9 wherein the multi-dimensional encoded data is arranged in an array that has rows and columns and comprises multiple folded codewords, wherein each folded codeword spans along more than a single row or column of the array; wherein the decoder is arranged to apply the first and third dimension decoding on single rows of the array; and to apply the second dimension decoding on single rows of the array.

14. The system according to claim 9 wherein the decoder is further arranged to:
  perform a fourth dimension decoding of each fourth dimension code component that comprises at least one of the one or more potentially erroneous encoded bits associated with the one or more errors found during the first dimension decoding, while not encoding fourth dimension code components that do not include any one of the one or more potentially erroneous encoded bits associated with the one or more errors found during the first dimension decoding;
  wherein a performing of the fourth dimension decoding comprises marking locations of one or more errors found during the fourth dimension decoding, if detecting the one or more errors during the fourth dimension decoding, without making suggested corrections to one or more potentially erroneous encoded bits associated with the one or more errors found during the fourth dimension decoding;
  perform a fifth dimension decoding of each fifth dimension code component that comprises at least one of the one or more potentially erroneous encoded bits associated with the one or more errors found during the first dimension decoding, while not encoding fifth dimension code components that do not include any one of the one or more potentially erroneous encoded bits associated with the one or more errors found during the first dimension decoding;
  wherein a performing of the fifth dimension decoding comprises marking locations of one or more errors found during the fifth dimension decoding, if detecting the one or more errors during the fifth dimension decoding, without making suggested corrections to one or more potentially erroneous encoded bits associated with the one or more errors found during the fifth dimension decoding; and
  determine whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; (c) the suggested corrections to the one or more potentially erroneous encoded bits associated with the one or more errors found during the third dimension decoding; (d) the suggested corrections to the one or more potentially erroneous encoded bits associated with the one or more errors found during the fourth dimension decoding; and (e) the suggested corrections to the one or more potentially erroneous encoded bits associated with the one or more errors found during the fifth dimension decoding.

15. The system of claim 14, wherein the decoder is arranged to change a value of an encoded bit if the encoded bit is associated with at least three errors found during at least three dimensions of the first, second, third, fourth and fifth dimensions.

16. The system according to claim 9 wherein the multi-dimensional encoded data is arranged in an array that has rows and columns and comprises multiple folded codewords, wherein each folded codeword spans along more than a single row or column of the array; wherein decoder is arranged to apply the first, third and fifth dimension decoding on single rows of the array; and to apply the second and fourth dimension decoding on single rows of the array.

17. A non-transitory computer readable medium that stores instructions that once executed by the computer cause the computer to execute the stages of:
receiving multi-dimensional encoded data potentially having errors, wherein the multi-dimensional encoded data comprises encoded bits generated by encoding each input bit in a set of input bits multiple times in multiple different dimensions;
performing a first dimension decoding of all the encoded bits, wherein the performing of the first dimension decoding comprises marking locations of one or more errors found during the first dimension decoding, if detecting the one or more errors during the first dimension decoding, without making suggested corrections to one or more potentially erroneous encoded bits associated with the one or more errors found during the first dimension decoding;
performing a second dimension decoding of each second dimension code component that comprises at least one of the one or more potentially erroneous encoded bits associated with the one or more errors found during the first dimension decoding, while not encoding second dimension code components that do not include any one of the one or more potentially erroneous encoded bits associated with the one or more errors found during the first dimension decoding;
wherein the performing of the second dimension decoding comprises marking locations of one or more errors found during the second dimension decoding, if detecting the one or more errors during the second dimension decoding, without making suggested corrections to one or more potentially erroneous encoded bits associated with the one or more errors found during the second dimension decoding;
performing a third dimension decoding of each third dimension code component that comprises at least one of the one or more potentially erroneous encoded bits associated with the one or more errors found during the first dimension decoding, while not encoding third dimension code components that do not include any one of the one or more potentially erroneous encoded bits associated with the one or more errors found during the first dimension decoding;
wherein the performing of the third dimension decoding comprises marking locations of one or more errors found during the third dimension decoding, if detecting the one or more errors during the third dimension decoding, without making suggested corrections to one or more potentially erroneous encoded bits associated with the one or more errors found during the third dimension decoding; and
determining whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; and (c) the suggested corrections to the one or more potentially erroneous encoded bits associated with the one or more errors found during the third dimension decoding.

18. The non-transitory computer readable medium of claim 17, that stores instructions for changing a value of an encoded bit if the encoded bit is associated with at least two errors found during at least two dimensions of the first, second and third dimensions.

19. The non-transitory computer readable medium of claim 17 wherein a performing of a certain dimension encoding out of the first, second and third dimensions comprises detecting an error in an encoded bit by comparing between outcomes the certain dimension decoding of different hypotheses that differ from each other by a value of the encoded bit.

20. The non-transitory computer readable medium according to claim 17 wherein at least one of the first, second and third dimension decoding includes soft decoding.

21. The non-transitory computer readable medium according to claim 17 wherein the multi-dimensional encoded data is arranged in an array that has rows and columns and comprises multiple folded codewords, wherein each folded codeword spans along more than a single row or column of the array; wherein the first and third dimension decoding are applied on single rows of the array; and wherein the second dimension decoding is applied on single rows of the array.

22. The non-transitory computer readable medium according to claim 17 that stores instructions for:
performing a fourth dimension decoding of each fourth dimension code component that comprises at least one of the one or more potentially erroneous encoded bits associated with the one or more errors found during the first dimension decoding, while not encoding fourth dimension code components that do not include any one of the one or more potentially erroneous encoded bits associated with the one or more errors found during the first dimension decoding;
wherein the performing of the fourth dimension decoding comprises marking locations of one or more errors found during the fourth dimension decoding, if detecting the one or more errors during the fourth dimension decoding, without making suggested corrections to one or more potentially erroneous encoded bits associated with the one or more errors found during the fourth dimension decoding;

performing a fifth dimension decoding of each fifth dimension code component that comprises at least one of the one or more potentially erroneous encoded bits associated with the one or more errors found during the first dimension decoding, while not encoding fifth dimension code components that do not include any one of the one or more potentially erroneous encoded bits associated with the one or more errors found during the first dimension decoding;

wherein the performing of the fifth dimension decoding comprises marking locations of one or more errors found during the fifth dimension decoding, if detecting the one or more errors during the fifth dimension decoding, without making suggested corrections to one or more potentially erroneous encoded bits associated with the one or more errors found during the fifth dimension decoding; and determining whether to change one or more values of the one or more potentially erroneous encoded bit associated with the one or more errors found during the first dimension decoding in response to (a) the suggested corrections to the one or more potentially erroneous encoded bits associated with the one or more errors found during the first dimension decoding; (b) the suggested corrections to the one or more potentially erroneous encoded bits associated with the one or more errors found during the second dimension decoding; (c) the suggested corrections to the one or more potentially erroneous encoded bits associated with the one or more errors found during the third dimension decoding; (d) the suggested corrections to the one or more potentially erroneous encoded bits associated with the one or more errors found during the fourth dimension decoding; and (e) the suggested corrections to the one or more potentially erroneous encoded bits associated with the one or more errors found during the fifth dimension decoding.

23. The non-transitory computer readable medium of claim 22 that stores instructions for changing a value of an encoded bit if the encoded bit is associated with at least three errors found during at least three dimensions of the first, second, third, fourth and fifth dimensions.

24. The non-transitory computer readable medium according to claim 17 wherein the multi-dimensional encoded data is arranged in an array that has rows and columns and comprises multiple folded codewords, wherein each folded codeword spans along more than a single row or column of the array; wherein the first, third and fifth dimension decoding are applied on single rows of the array; and wherein the second and fourth dimension decoding are applied on single rows of the array.

* * * * *